US010862445B2

(12) United States Patent
Sugie

(10) Patent No.: US 10,862,445 B2
(45) Date of Patent: Dec. 8, 2020

(54) MAGNETIC DISK DEVICE CAPABLE OF ADJUSTING FREQUENCY OF OUTPUT SIGNALS FOR AN IN-PHASE AC CURRENT SIGNAL INPUTS

(71) Applicant: ROHM Co., LTD., Kyoto (JP)

(72) Inventor: Hisashi Sugie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 92 days.

(21) Appl. No.: 16/227,594

(22) Filed: Dec. 20, 2018

(65) Prior Publication Data

US 2019/0199305 A1 Jun. 27, 2019

(30) Foreign Application Priority Data

Dec. 22, 2017 (JP) ................. 2017-246330

(51) Int. Cl.
*H03F 3/45* (2006.01)
*H02K 11/33* (2016.01)
*H02K 41/035* (2006.01)
*G11B 19/20* (2006.01)
*H03F 3/217* (2006.01)

(52) U.S. Cl.
CPC ..... *H03F 3/45636* (2013.01); *G11B 19/2009* (2013.01); *H02K 11/33* (2016.01); *H02K 41/0354* (2013.01); *H03F 3/2173* (2013.01); *H03F 3/45475* (2013.01); *H03F 2200/129* (2013.01); *H03F 2200/144* (2013.01); *H03F 2203/45116* (2013.01); *H03F 2203/45514* (2013.01); *H03F 2203/45526* (2013.01); *H03F 2203/45528* (2013.01)

(58) Field of Classification Search
None
See application file for complete search history.

(56) References Cited

U.S. PATENT DOCUMENTS

| 7,551,033 | B2 * | 6/2009 | Lin ................... H03F 1/083 330/253 |
| 9,018,929 | B2 * | 4/2015 | Isham ............... H02M 3/158 323/283 |
| 10,218,375 | B2 * | 2/2019 | Fukuzawa ......... H03M 1/46 |
| 10,305,490 | B2 * | 5/2019 | Fukuzawa ......... H03B 5/32 |
| 2012/0049920 | A1 * | 3/2012 | Kurachi ............. H03H 7/20 327/254 |

FOREIGN PATENT DOCUMENTS

JP 10-126172 A 5/1998

* cited by examiner

*Primary Examiner* — Tan X Dinh
(74) *Attorney, Agent, or Firm* — Chip Law Group

(57) ABSTRACT

Disclosed herein is an amplification circuit that outputs an output signal formed by amplifying a differential signal between a first input terminal and a second input terminal using an operating amplifier and a plurality of resistors, the amplification circuit including an adjustment circuit configured to adjust a frequency property of the output signal for an in-phase alternating current signal input between the first input terminal and the second input terminal. The adjustment circuit is connected to one input terminal of the first input terminal and the second input terminal through one or more resistors, the adjustment circuit includes a capacitor part whose capacitance is set to be variable, and the adjustment is realized through variable setting of the capacitance of the capacitor part.

13 Claims, 15 Drawing Sheets

MAGNETIC DISK DEVICE CAPABLE OF ADJUSTING FREQUENCY OF OUTPUT SIGNALS FOR AN IN-PHASE AC CURRENT SIGNAL INPUTS

BACKGROUND

This U.S. application claims priority benefit of Japanese Patent Application No. 2017-246330 filed in the Japan Patent Office on Dec. 22, 2017. Each of the above-referenced applications is hereby incorporated herein by reference in its entirety.

The present technology relates to an amplification circuit, and a semiconductor device and a motor driver device that are related to the amplification circuit.

As depicted in FIG. 15, an amplification circuit formed by an operating amplifier and plural resistors (a differential amplification circuit) is generally known.

On the other hand, a common mode rejection ratio (hereinafter, may be referred to as "CMRR") is present as one of the important properties of the amplification circuit of this type.

Examples of the related art include Japanese Patent Laid-Open No. 10-126172

SUMMARY

In the case where an amplification circuit as depicted in FIG. 15 is formed as a semiconductor integrated circuit, or the like, even when the layout pattern thereof is designed such that a CMRR that is excellent as much as possible is obtained, no expected CMRR may be obtained due to influences such as the fabrication dispersion. For an amplification circuit, achievement of its excellent CMRR is naturally important.

Thus, there is a need for an amplification circuit that contributes to improvement of CMRR, and a semiconductor device and a motor driver device relating to the amplification circuit.

According to a mode of the present technology, there is provided an amplification circuit that outputs an output signal formed by amplifying a differential signal between a first input terminal and a second input terminal using an operating amplifier and a plurality of resistors, the amplification circuit including an adjustment circuit configured to adjust a frequency property of the output signal for an in-phase alternating current signal input between the first input terminal and the second input terminal. The adjustment circuit is connected to one input terminal of the first input terminal and the second input terminal through one or more resistors, the adjustment circuit includes a capacitor part whose capacitance is set to be variable, and the adjustment is realized through variable setting of the capacitance of the capacitor part.

For the amplification circuit, "the adjustment circuit is connected to one input terminal of the first input terminal and the second input terminal through one or more resistors" does not limit the number of the adjustment circuits to one and, for the amplification circuit according to the present technology, the fact is not excluded that another adjustment circuit is also connected to the other input terminal of the first input terminal and the second input terminal through other one or more resistors.

More specifically, for example, in the amplification circuit, an inverting input terminal of the operating amplifier may be connected to the one input terminal through a first resistor and be also connected to an output terminal of the operating amplifier through a series circuit of a second resistor and a third resistor, a non-inverting input terminal of the operating amplifier may be input with a signal based on a signal at another input terminal of the first input terminal and the second input terminal, and the adjustment circuit may be inserted between a connection node between the second resistor and the third resistor, and a predetermined potential point.

Otherwise, for example, in the amplification circuit, a non-inverting input terminal of the operating amplifier may be connected to the one input terminal through a first resistor and be also connected to a predetermined first potential point through a series circuit of a second resistor and a third resistor, an inverting input terminal of the operating amplifier may be input with a signal based on a signal at another input terminal of the first input terminal and the second input terminal, and the adjustment circuit may be inserted between a connection node between the second resistor and the third resistor, and a predetermined second potential point.

Furthermore, otherwise, for example, in the amplification circuit, a first adjustment circuit and a second adjustment circuit each including a capacitor part whose capacitance is set to be variable may be disposed as the adjustment circuit, an inverting input terminal of the operating amplifier may be connected to the first input terminal through a first resistor and be also connected to an output terminal of the operating amplifier through a series circuit of a second resistor and a third resistor, the first adjustment circuit may be inserted between a connection node between the second resistor and the third resistor, and a predetermined first potential point, a non-inverting input terminal of the operating amplifier may be connected to the second input terminal through a fourth resistor and be also connected to a predetermined second potential point through a series circuit of a fifth resistor and a sixth resistor, and the second adjustment circuit may be inserted between a connection node between the fifth resistor and the sixth resistor, and a predetermined third potential point.

Furthermore, otherwise, for example, in the amplification circuit, an inverting input terminal of the operating amplifier may be connected to the one input terminal through a first resistor and be also connected to an output terminal of the operating amplifier through a second resistor, a non-inverting input terminal of the operating amplifier may be input with a signal based on a signal at another input terminal of the first input terminal and the second input terminal, and the adjustment circuit may be inserted between an inverting input terminal of the operating amplifier and a predetermined potential point.

Furthermore, otherwise, for example, in the amplification circuit, a non-inverting input terminal of the operating amplifier may be connected to the one input terminal through a first resistor and be also connected to a predetermined first potential point through a second resistor, an inverting input terminal of the operating amplifier may be input with a signal based on a signal at another input terminal of the first input terminal and the second input terminal, and the adjustment circuit may be inserted between a non-inverting input terminal of the operating amplifier and a predetermined second potential point.

Furthermore, otherwise, for example, in the amplification circuit, a first adjustment circuit and a second adjustment circuit each including a capacitor part whose capacitance is set to be variable may be disposed as the adjustment circuit, an inverting input terminal of the operating amplifier may be connected to the first input terminal through a first resistor and be also connected to an output terminal of the operating amplifier through a second resistor, the first adjustment circuit may be inserted between an inverting input terminal of the operating amplifier and a predetermined first potential point, a non-inverting input terminal of the operating amplifier may be connected to the second input terminal through a third resistor and be also connected to a predetermined second potential point through a fourth resistor, and the second adjustment circuit may be inserted between a non-inverting input terminal of the operating amplifier and a predetermined third potential point.

Furthermore, otherwise, for example, in the amplification circuit, an inverting input terminal of the operating amplifier may be connected to the one input terminal through a series circuit of a first resistor and a second resistor and be also connected to an output terminal of the operating amplifier through a third resistor, a non-inverting input terminal of the operating amplifier may be input with a signal based on a signal at another input terminal of the first input terminal and the second input terminal, and the adjustment circuit may be inserted between a connection node between the first resistor and the second resistor, and a predetermined potential point.

Furthermore, otherwise, for example, in the amplification circuit, a non-inverting input terminal of the operating amplifier may be connected to the one input terminal through a series circuit of a first resistor and a second resistor and be also connected to a predetermined first potential point through a third resistor, an inverting input terminal of the operating amplifier may be input with a signal based on a signal at another input terminal of the first input terminal and the second input terminal, and the adjustment circuit may be inserted between a connection node between the first resistor and the second resistor, and a predetermined second potential point.

Furthermore, otherwise, for example, in the amplification circuit, a first adjustment circuit and a second adjustment circuit each including a capacitor part whose capacitance is set to be variable may be disposed as the adjustment circuit, an inverting input terminal of the operating amplifier may be connected to the first input terminal through a series circuit of a first resistor and a second resistor and be also connected to an output terminal of the operating amplifier through a third resistor, the first adjustment circuit may be inserted between a connection node between the first resistor and the second resistor, and a predetermined first potential point, a non-inverting input terminal of the operating amplifier may be connected to the second input terminal through a series circuit of a fourth resistor and a fifth resistor and be also connected to a predetermined second potential point through a sixth resistor, and the second adjustment circuit may be inserted between a connection node between the fourth resistor and the fifth resistor, and a predetermined third potential point.

Moreover, for example, the amplification circuit may produce the output signal on a basis of a signal obtained by causing a signal at an output terminal of the operating amplifier to pass through a lowpass filter.

According to another mode of the present technology, there is provided a semiconductor device that forms the amplification circuit and is characterized in that the amplification circuit is formed using an integrated circuit.

According to a further mode of the present technology, there is provided a motor driver device that drives a motor, includes an amplification circuit amplifying and outputting a signal that corresponds to a current supplied to the motor, and an output-stage circuit that applies a voltage corresponding to an output signal of the amplification circuit, to the motor, and is characterized in that the motor driver device includes, as the amplification circuit, the above-described amplification circuit according to the mode of the present technology and a signal corresponding to the current supplied to the motor is applied to a point between the first input terminal and the second input terminal.

According to the modes of the present technology, an amplification circuit that contributes to improvement of the CMRR, and a semiconductor device and a motor driver device relating to the amplification circuit can be provided.

DETAILED DESCRIPTION OF THE PREFERRED EMBODIMENT

Figure 1:
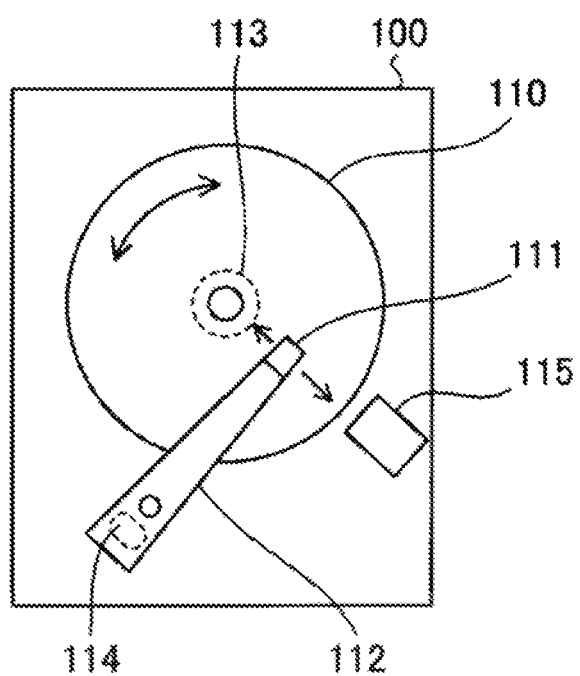
FIG. 1 is a schematic configuration diagram relating to a mechanism of a hard disc device according to an embodiment of the present technology.

Examples of embodiment of the present technology will be described in detail with reference to the drawings. In the drawings to be referred to, same parts are given the same reference numeral and redundant description relating to these same parts will basically not be made. In addition, for simplicity of description herein, the name of information, a signal, a physical amount, a member, or the like that corresponds to a symbol or a reference numeral may not be presented or may be simplified by presenting the symbol or the reference numeral that refers to the information, the signal, the physical amount, the member, or the like.

Figure 2A:
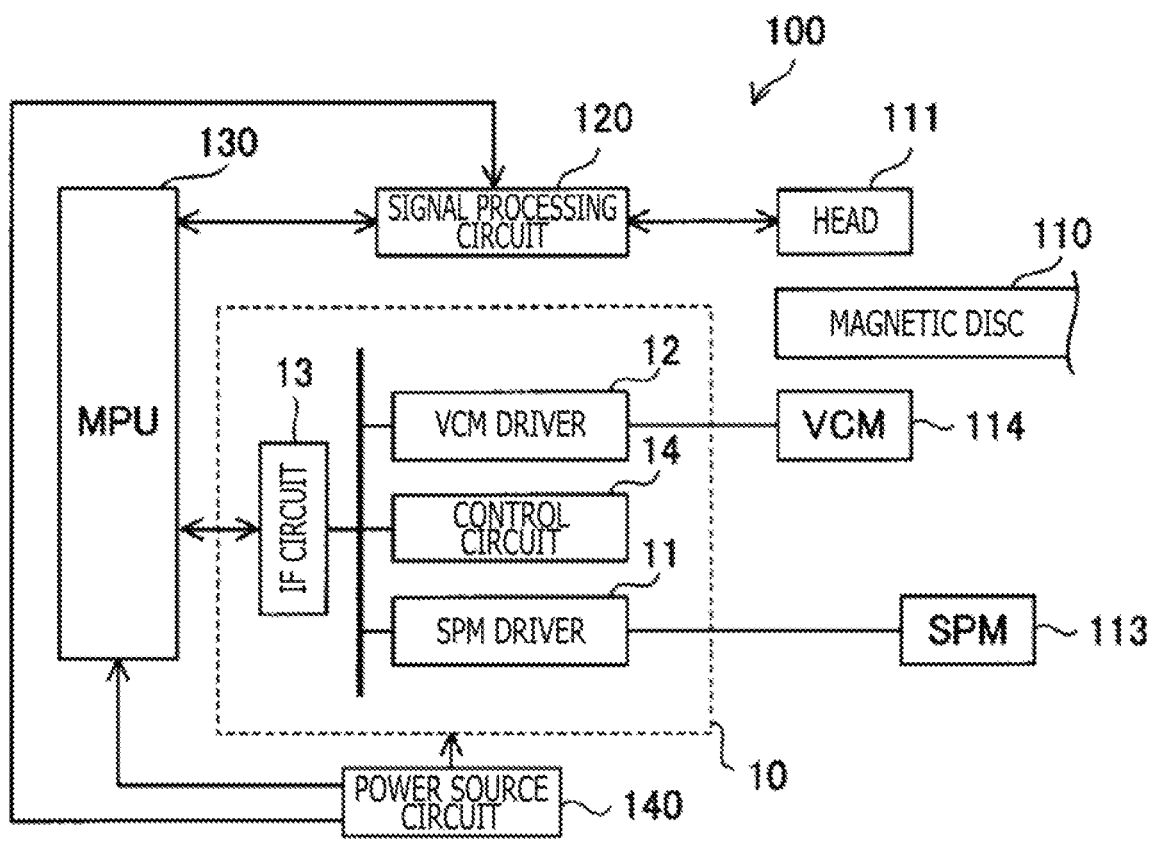
FIGS. 2A and 2B are a schematic electric block diagram of the hard disc device according to the embodiment of the present technology and a perspective diagram of an outer appearance of a driver integrated circuit (IC) mounted on the hard disc device.

FIG. 1 is a schematic configuration diagram relating to a mechanism of a hard disc device (hereinafter, referred to as "hard disc drive (HDD) device") 100 as a magnetic disc device according to the embodiment of the present technology. FIG. 2A is a schematic electric block diagram of the HDD device 100.

The HDD device 100 includes a magnetic disc 110 as a recording medium, a head 111 that is a magnetic head performing writing and reading of information for the magnetic disc 110, an arm 112 that supports the head 111 to be freely movable in the radial direction of the magnetic disc 110, a spindle motor 113 (hereinafter, referred to as "SPM 113") that supports and rotates the magnetic disc 110, a voice coil motor 114 (hereinafter, referred to as "VCM 114") that moves and positions the head 111 in the radial direction of the magnetic disc 110 by driving the arm 112 for its rotation and positioning the arm 112, and a ramp part 115 that holds the head 111 at a predetermined retreat position distant from the magnetic disc 110 when the head 111 moves to be on the outer side of the outer circumference of the magnetic disc 110. The magnetic disc 110, the head 111, the arm 112, the SPM 113, the VCM 114, and the ramp part 115 are accommodated in a housing of the HDD device 100. The "move in the radial direction of the magnetic disc 110" means a move in a direction that connects the outer circumference and the center of the magnetic disc 110 that has a disc-like shape while the "move in the radial direction of the magnetic disc 110" may include a component of the move in another direction (such as, for example, the direction of a tangent line of the outer circumference of the magnetic disc) in addition to the component of the move in the direction that connects the outer circumference and the center of the magnetic disc 110.

The HDD device 100 has a driver IC 10, a signal processing circuit 120, a micro-processing unit (MPU) 130, and a power source circuit 140 disposed therein as its electric constituent parts. The power source circuit 140 supplies a power source voltage to drive the driver IC 10, the signal processing circuit 120, and the MPU 130 to these constituent parts.

When information is written into the magnetic disc 110, the signal processing circuit 120 outputs a recording signal to write the information to the head 111 and, when information is read from the magnetic disc 110, the signal processing circuit 120 applies a necessary signal processing to the signal read from the magnetic disc 110 and transfers a signal obtained thereby to the MPU 130. The MPU 130 controls the writing operation and the reading operation performed for the information by the head 111 through the control for the signal processing circuit 120.

Figure 2B:
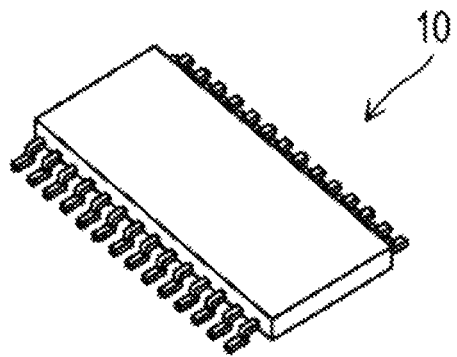

The driver IC 10 is an electronic part (a motor driver device) formed by sealing a semiconductor integrated circuit in a housing (a package) constituted by a resin, as depicted in FIG. 2B. The number of pins (the number of external terminals) of the driver IC 10 depicted in FIG. 2B is only an exemplification. The driver IC 10 has an SPM driver 11 to drive the SPM 113 and a VCM driver 12 to drive the VCM 114 disposed therein and, in addition, has an interface (IF) circuit 13 to enable interactive communication between the MPU 130 and the driver IC 10, a control circuit 14 that controls operations of the SPM driver 11 and the VCM driver 12 on the basis of control data received by the IF circuit 13 from the MPU 130, and the like disposed therein.

The MPU 130 controls the rotation of the magnetic disc 110 through driving and controlling the SPM 113 by controlling the SPM driver 11 of the driver IC 10, and performs move control and positioning for the head 111 through driving and controlling the VCM 114 by controlling the VCM driver 12 of the driver IC 10. Position information indicating each of positions of points on the magnetic disc 110 is recorded at each of the points of the magnetic disc 110 and, when the head 111 is positioned on the magnetic disc 110, the position information is read by the head 111 and is delivered to the MPU 130 through the signal processing circuit 120. The MPU 130 can control the VCM driver 12 on the basis of the position information and, through this control, the VCM driver 12 supplies a driving current necessary for the VCM 114 to thereby realize the move and the positioning of the head 111. In addition, "the head 111 is positioned on the magnetic disc 110" means that the head 111 is positioned above the magnetic disc 110 isolated therefrom sandwiching a micro space therebetween.

Figure 3:
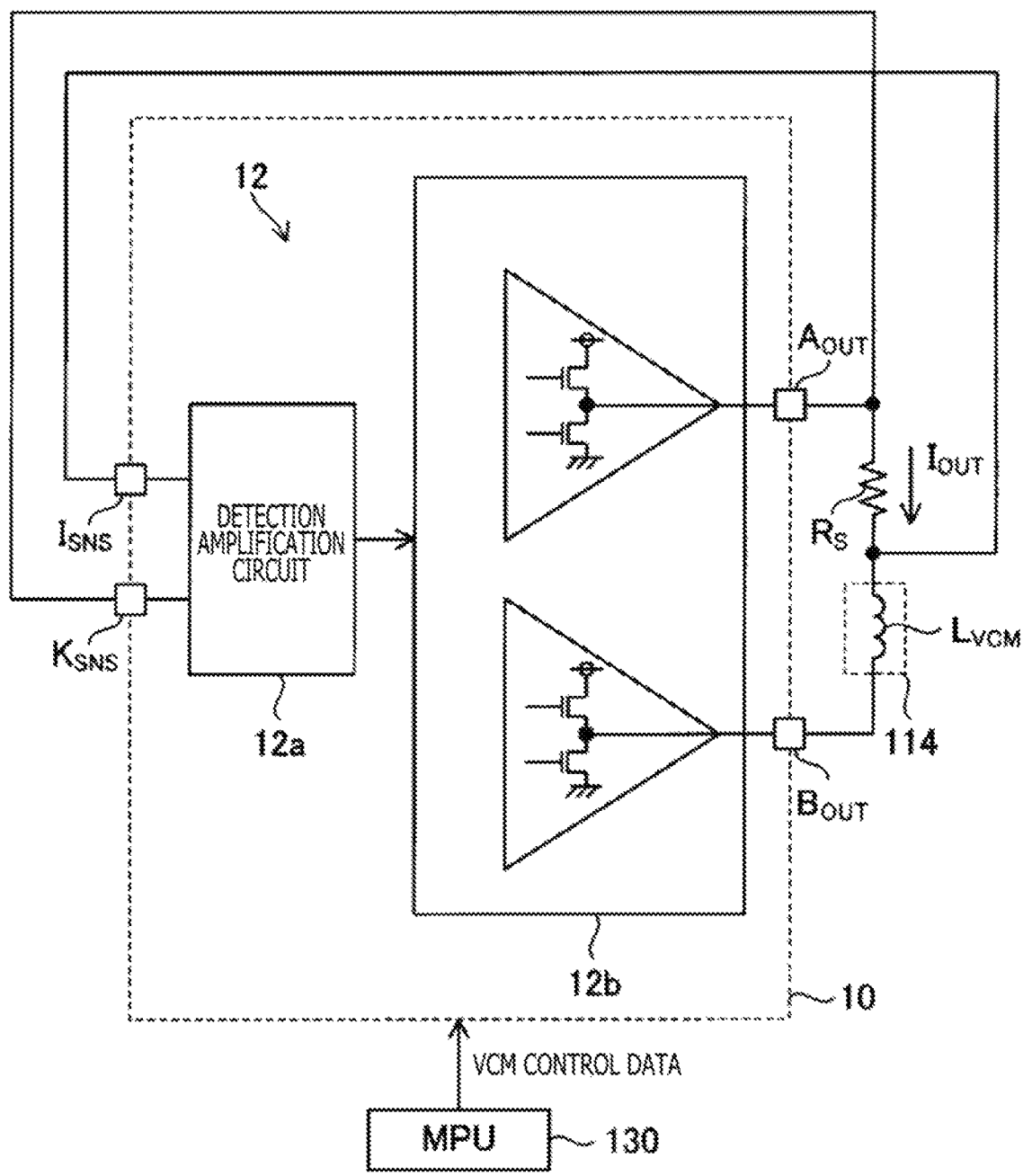
FIG. 3 is a block diagram relating to a voice coil motor (VCM) and a VCM driver according to the embodiment of the present technology.

FIG. 3 depicts a block diagram relating to the VCM 114 and the VCM driver 12. The external terminals disposed on the driver IC 10 include terminals AOUT, BOUT, ISNS, and KSNS. The VCM 114 includes two permanent magnets and a coil arranged in a magnetic field formed by the two permanent magnets. "LVCM" represents the coil constituting the VCM 114. "IOUT" represents the driving current of the VCM 114 that is the current supplied to the VCM 114. The current supply to the VCM 114 naturally means the current supply to the coil LVCM. A series circuit of a sensing resistor RS and the coil LVCM is connected between the terminals AOUT and BOUT. More specifically, one end of the sensing resistor RS is connected to the terminal AOUT while the one end of the coil LVCM is connected to the terminal BOUT, and the other ends of the sensing resistor RS and the coil LVCM are connected to each other.

The driving current IOUT flows to the point between the terminals AOUT and BOUT through the series circuit of the sensing resistor RS and the coil LVCM. In the above, it is assumed that the polarity of the driving current IOUT flowing from the terminal AOUT toward the terminal BOUT is positive and the polarity of the driving current IOUT flowing from the terminal BOUT toward the terminal AOUT is negative. The VCM driver 12 can supply the positive or the negative driving current IOUT to the coil LVCM complying with an electric-current order from the MPU 130. The head 111 is moved from the outer circumference side of the magnetic disc 110 toward the center of the magnetic disc 110 by supplying the positive driving current IOUT to the coil LVCM, and the head 111 is moved from the center of the magnetic disc 110 toward the outer circumference side of the magnetic disc 110 by supplying the negative driving current IOUT to the coil LVCM.

As an overview, the VCM driver 12 includes a detection amplification circuit 12a that amplifies and outputs a signal corresponding to the driving current IOUT to detect the driving current IOUT, and an output-stage circuit 12b that drives the VCM 114 by applying a voltage corresponding to the output signal of the detection amplification circuit 12a to the VCM 114 (in other words, applies the voltage to the coil LVCM). A voltage drop generated at the sensing resistor RS (that is, the voltage between the terminals of the sensing resistor RS) is input into the detection amplification circuit 12a as a signal corresponding to the driving current IOUT. More specifically, the terminal AOUT connected to the one end of the sensing resistor RS is connected to the terminal KSNS, the other end of the sensing resistor RS is connected to the terminal ISNS, and the detection amplification circuit 12a amplifies a voltage signal between the terminals KSNS and ISNS that is a signal corresponding to the magnitude and the direction of the driving current IOUT. In addition, it is assumed in the above that the sensing resistor RS is an external resistor disposed in the exterior of the driver IC 10 while the sensing resistor RS may be formed inside the driver IC 10. In this case, wiring that delivers the signal of the voltage drop of the sensing resistor RS may be disposed inside the driver IC 10.

The MPU 130 can supply VCM control data that instructs a torque of the VCM 114, to the driver IC 10. The magnitude and the direction of the driving current IOUT to be supplied to the VCM 114 are defined by the VCM control data and the VCM control data can therefore be also considered as an electric-current order. When the head 111 is positioned on the magnetic disc 110, the MPU 130 can produce the VCM control data on the basis of the position information read from the head 111. In the state where no position information is read by the head 111 such as the case where the head 111 is positioned on the outer side of the outer circumference of the magnetic disc 110, the MPU 130 can produce the VCM control data not relying on the position information. For example, the VCM control data instructing the supply of the predetermined positive driving current IOUT only has to be produced in the case where the head 111 is moved to be on the magnetic disc 110 from the retreat position.

The output-stage circuit 12b in the VCM driver 12 supplies a driving voltage for the VCM 114 (in other words, an application voltage for the coil LVCM) to the point between the terminals AOUT and BOUT such that the driving current IOUT that is based on the output signal of the detection amplification circuit 12a corresponding to the magnitude and the direction of the driving current IOUT and the VCM control data from the MPU 130 and that corresponds to the VCM control data is supplied to the VCM 114.

In the above, the output-stage circuit 12b can operate in a PWM driving scheme according to which a pulse-width-modulated voltage is supplied as the driving voltage for the VCM 114 and the electric power is thereby intermittently supplied to the VCM 114 or in a linear driving scheme according to which a continuous voltage not pulse-width-modulated is supplied as the driving voltage for the VCM 114 and the electric power is thereby always supplied to the VCM 114. The output-stage circuit 12b may have a circuit for the PWM driving scheme and a circuit for the linear driving scheme disposed therein and, in this case, the VCM 114 is driven in either the PWM driving scheme or the linear driving scheme by using either one of these circuits being switched to. In addition, of the circuit for the PWM driving scheme and the circuit for the linear driving scheme, a portion of the one circuit may be used also as a portion of the other circuit.

Figure 4:
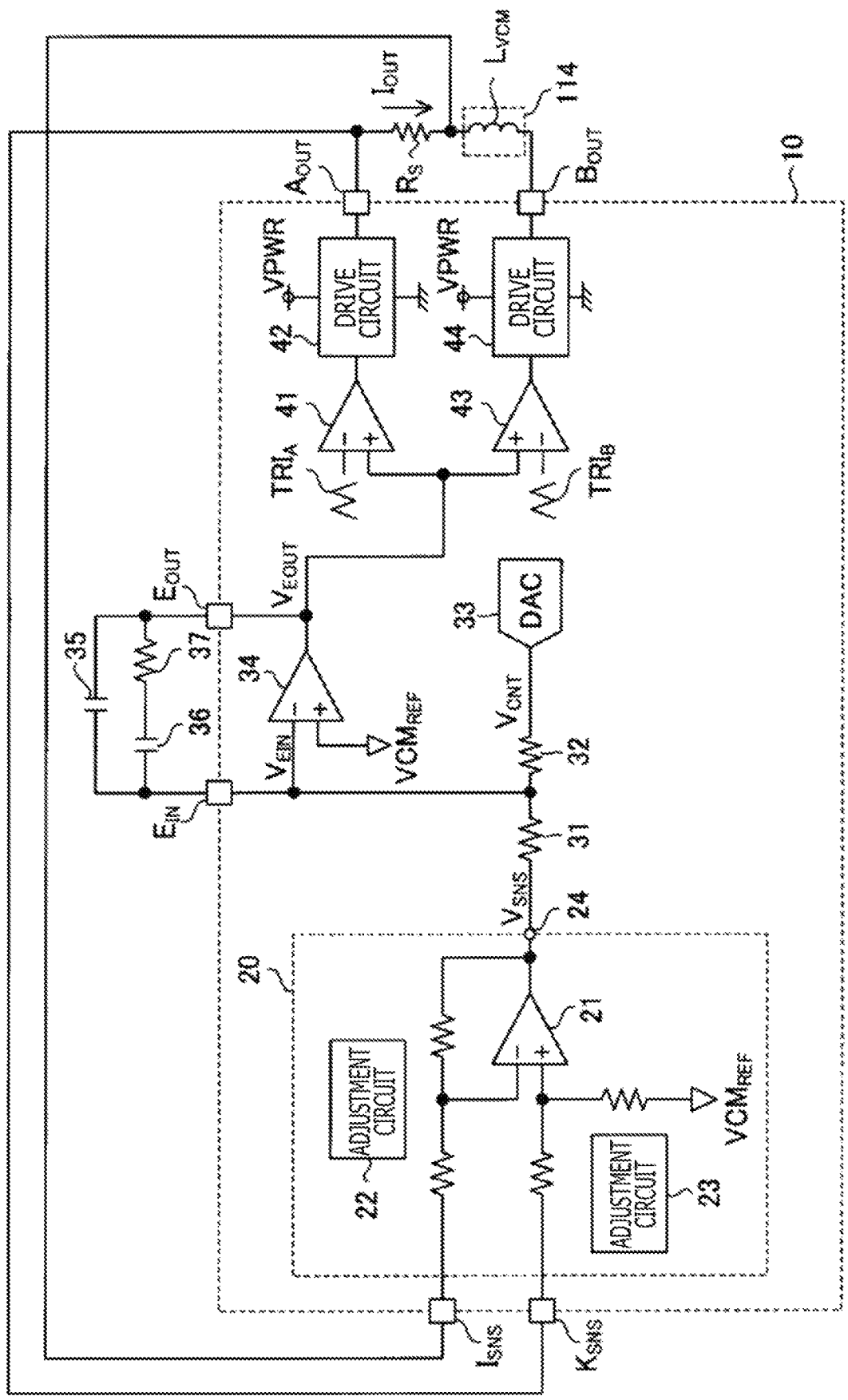
FIG. 4 is a configuration diagram of a circuit according to the embodiment of the present technology and to drive the VCM using a pulse width modulation (PWM) driving method.

The circuit configuration to drive the VCM 114 in the PWM driving scheme will be described with reference to FIG. 4. The driver IC 10 in FIG. 4 includes a detection amplification circuit 20 that corresponds to the detection amplification circuit 12a in FIG. 3 and components denoted by reference numerals 31 to 34 and 41 to 44. In FIG. 4, in addition to the terminals AOUT, BOUT, ISNS, and KSNS, terminals EIN and EOUT are also depicted as the external terminals disposed on the driver IC 10. As described with reference to FIG. 3, the connection node between the one end of the sensing resistor RS through which the driving current IOUT of the VCM 114 flows and the terminal AOUT is connected to the terminal KSNS, and the other end of the sensing resistor RS (that is, the connection node of the sensing resistor RS and the coil LVCM) is connected to the terminal ISNS.

The detection amplification circuit 20 is a differential amplification circuit that amplifies a voltage between the terminals ISNS and KSNS, that is, a difference voltage (a differential signal) to be the difference between the potential at the terminal ISNS and the potential at the terminal KSNS, and that outputs the amplified differential voltage from an internal output terminal 24 as a detected voltage VSNS. The voltage amplification factor of the detection amplification circuit 20 is optional and may be "1." The detected magnitude and the detected polarity of the driving current IOUT is presented by the detected voltage VSNS. The detection amplification circuit 20 includes an operating amplifier (ope-amp) 21 and plural resistors, and amplifies the voltage between the terminals ISNS and KSNS using the operating amplifier 21 to apply a negative feedback using the resistors. The detection amplification circuit 20 has adjustment circuits 22 and 23 disposed therein that each contribute to improvement of the AC common mode rejection ratio in the detection amplification circuit 20, and detailed circuit examples of the detection amplification circuit 20 that includes the adjustment circuits 22 and 23 will be described later.

A digital-analog converter (DAC) 33 converts the digital VCM control data from the MPU 130 into an analog control voltage VCNT and outputs the control voltage VCNT. The internal output terminal 24 to which the detected voltage VSNS is applied is connected to an end of the resistor 31, and an output terminal of the DAC 33 to which the control voltage VCNT is applied is connected to an end of the resistor 32. The other ends of the resistors 31 and 32 are connected to each other and are connected to an inverting input terminal of an error amplifier 34 and the terminal EIN. The non-inverting input terminal of the error amplifier 34 is applied with a predetermined reference voltage VCMREF that is a direct current (DC) produced in the driver IC 10. The reference voltage VCMREF may be a voltage that is variably set by the driver IC 10 while it is assumed in this case that the reference voltage VCMREF is fixed at a predetermined DC voltage value.

The error amplifier 34 amplifies an error between a voltage VEIN at the connection node between the resistors 31 and 32 based on the detected voltage VSNS and the control voltage VCNT, and the reference voltage VCMREF, and outputs the amplified error from the output terminal of the error amplifier 34 as an error voltage VEOUT. It is assumed as an example in this case that an integrator is constituted by the error amplifier 34, the capacitors 35 and 36, and the resistor 37. The inverting input terminal and the output terminal of the error amplifier 34 are therefore connected respectively to the terminals EIN and EOUT and the capacitor 35 is connected between the terminals EIN and EOUT, and a series circuit of a capacitor 36 and the resistor 37 for compensating the phase is also connected between the terminals EIN and EOUT. It is assumed in this case that the capacitors 35 and 36, and the resistor 37 are disposed as the external parts of the driver IC 10 while all or a part of the capacitors 35 and 36, and the resistor 37 may be incorporated in the driver IC 10.

The error voltage VEOUT is supplied to non-inverting input terminals of comparators 41 and 43. The driver IC 10 has a circuit (not depicted) disposed therein that produces triangular wave signals TRIA and TRIB having a common PWM frequency, and the triangular wave signals TRIA and TRIB are respectively supplied to inverting input terminals of the comparators 41 and 43. The triangular wave signals TRIA and TRIB are signals each having a triangular shape different from that of each other.

The comparator 41 outputs a voltage signal at a high level when the error voltage VEOUT is higher than the voltage of the triangular wave signal TRIA, and outputs a voltage signal at a low level that is lower than the high level when the error voltage VEOUT is not higher than the voltage of the triangular wave signal TRIA. Similarly, the comparator 43 outputs a voltage signal at a high level when the error voltage VEOUT is higher than the voltage of the triangular wave signal TRIB, and outputs a voltage signal at a low level when the error voltage VEOUT is not higher than the voltage of the triangular wave signal TRIB.

The output signals of the comparators 41 and 43 are respectively supplied to drive circuits 42 and 44. The drive circuits 42 and 44 apply a switching voltage obtained by switching the positive power source voltage VPWR using a PWM frequency on the basis of the output signals of the comparators 41 and 43 (that is, a switching voltage obtained by pulse-width-modulating the positive power source voltage VPWR using the PWM frequency) to the point between the terminals AOUT and BOUT. In addition, the power source voltage VPWR is the positive DC voltage based on a supply voltage from the power source circuit 140.

The duty ratio of the switching and which one of the terminals AOUT and BOUT is on the low potential side for the switching voltage depend on the error voltage VEOUT. An output-stage circuit including the comparators 41 and 43, and the drive circuits 42 and 44 (corresponding to the output-stage circuit 12b in FIG. 3) supplies a switching voltage obtained by switching the positive power source voltage VPWR using the PWM frequency and at the duty ratio based on the error voltage VEOUT to the point between the terminals AOUT and BOUT for the terminal BOUT to be on the low potential side when the positive driving current IOUT has to be supplied to the VCM 114 on the basis of the error voltage VEOUT, and supplies the switching voltage to the point between the terminals AOUT and BOUT for the terminal AOUT to be on the low potential side when the negative driving current IOUT has to be supplied to the VCM 114 on the basis of the error voltage VEOUT.

The drive circuits 42 and 44 may each be constituted by a half-bridge circuit that switches the power source voltage VPWR, and the drive circuits 42 and 44 may constitute a full-bridge circuit for the VCM 114. In addition, the circuit configuration described with reference to FIG. 4 is only an exemplification and the VCM driver 12 is optional only when the VCM driver 12 is a circuit that can drive the VCM 114 by applying the pulse-width-modulated voltage to the VCM 114 on the basis of the amplified signal of the voltage drop of the sensing resistor RS that presents the detection result of the driving current IOUT.

Figure 5:
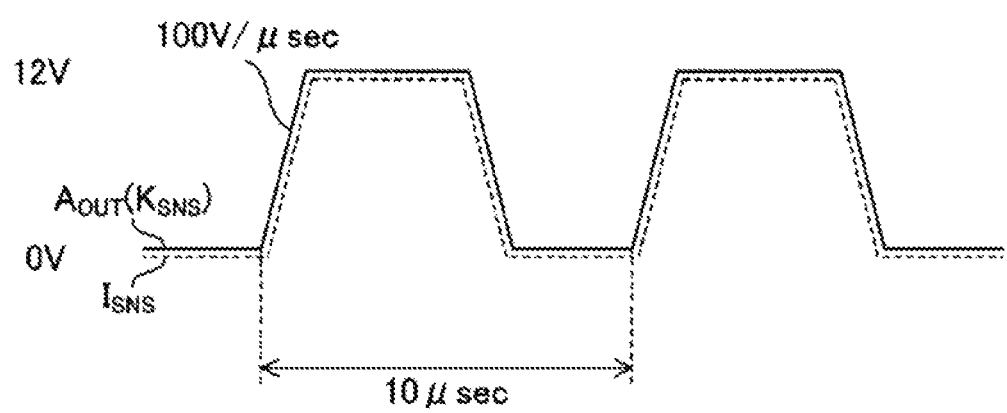
FIG. 5 is a chart depicting voltage waveforms at two terminals of the driver IC, according to the embodiment of the present technology.

FIG. 5 depicts an example of the voltage waveforms at the terminals AOUT and ISNS obtained when the switching voltage for the terminal BOUT to be on the low potential side is supplied to the point between the terminals AOUT and BOUT. It is assumed in this case that the PWM frequency is 100 kilohertzes (kHz), the slew rate of the voltage variation of the switching voltage is 100 volts/microsecond (V/μsec), and the power source voltage VPWR is 12 volts (V). The potentials of the terminals ISNS and KSNS that are the input terminals of the detection amplification circuit 20 each therefore vary in a range substantially from 0 to 12 V. The same is applied to the case where the switching voltage for the terminal AOUT to be on the low potential side is supplied to the point between the terminals AOUT and BOUT. In addition, the driver IC 10 may be formed such that the PWM frequency is variable (for example, such that the PWM frequency is variable in a range from 50 to 200 kHz).

A CMRR is naturally important for the detection amplification circuit 20 that differentially amplifies the difference voltage (the differential signal) between the terminals ISNS and KSNS. A DC CMRR and an AC CMRR are present as the CMRRs of the detection amplification circuit 20 while the CMRR in a band in the vicinity of 100 kHz or exceeding 100 kHz is important for improving the precision of the driving control for the VCM 114 because the input signal into the detection amplification circuit 20 includes the above high frequency component.

When a differential amplification circuit is formed using the operating amplifier 21, the CMRR is shifted to some extent from the ideal one depending on the dispersion in the fabrication even though the layout pattern is produced with ideas such that the CMRR becomes close to the ideal one. The detection amplification circuit 20 includes a circuit to improve the DC CMRR (the details thereof will be described later) while, as a noteworthy item, the detection amplification circuit 20 also includes the adjustment circuits 22 and 23 to improve the AC CMRR.

Detailed circuit examples will be presented later while the adjustment circuit 22 is connected to the terminal ISNS through one or more resistors such that the adjustment circuit 22 can adjust the frequency property of the output signal of the operating amplifier 21 for an in-phase AC signal input into the point between the terminals ISNS and KSNS, and the adjustment circuit 23 is connected to the terminal KSNS through one or more other resistors such that the adjustment circuit 23 can adjust the frequency property of the output signal of the operating amplifier 21 for an in-phase AC signal input into the point between the terminals ISNS and KSNS.

Figure 6A:
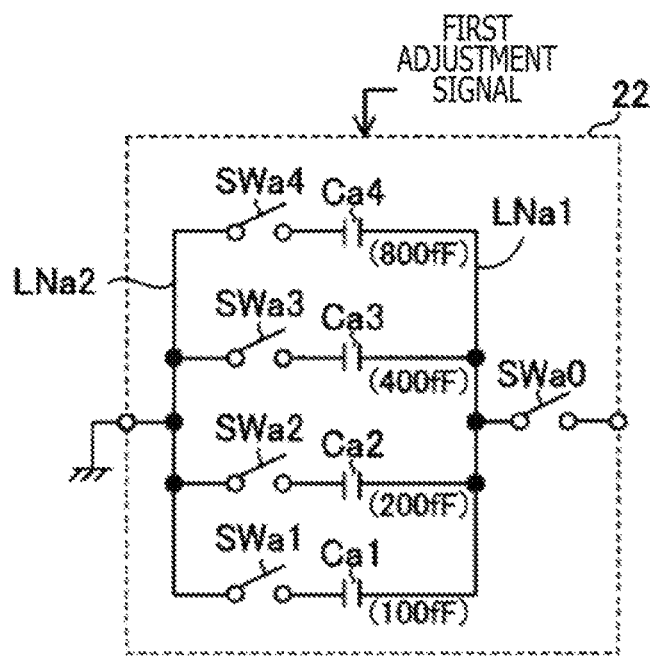
FIGS. 6A and 6B are circuit diagrams of adjustment circuits, disposed in the driver IC and according to the embodiment of the present technology.
Figure 6B:
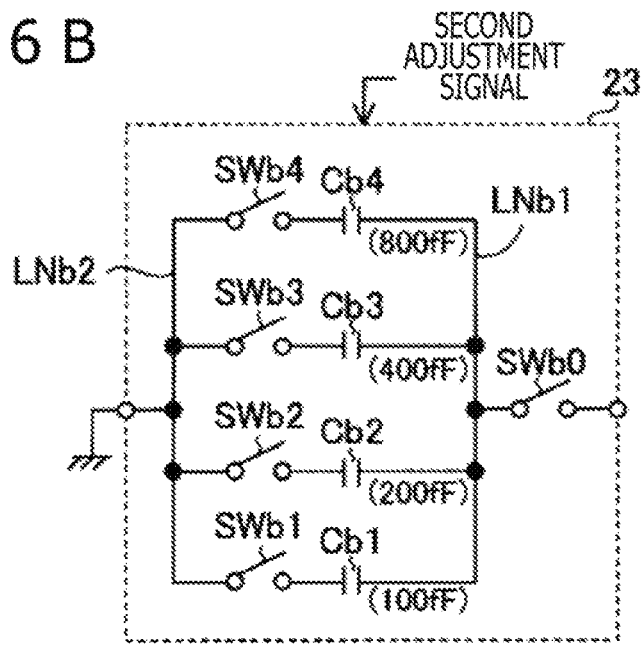

FIGS. 6A and 6B respectively depict the circuit configurations of the adjustment circuits 22 and 23. The adjustment circuits 22 and 23 are incorporated in an amplification circuit like the detection amplification circuit 20 in FIG. 7 described later while the configuration as a single component of each of the adjustment circuits 22 and 23 will first be described.

The adjustment circuit 22 includes capacitors Ca1 to Ca4, switches SWa0 to SWa4, and wires LNa1 and LNa2. The wire LNa1 is connected to the wire LNa2 through a series circuit of the capacitor Ca1 and the switch SWa1, a series circuit of the capacitor Ca2 and the switch SWa2, a series circuit of the capacitor Ca3 and the switch SWa3, and a series circuit of the capacitor Ca4 and the switch SWa4. These four series circuits are therefore connected in parallel to each other and the wire LNa1 is connected to the wire LNa2 through a circuit having therein the four series circuits connected in parallel to each other. The wire LNa2 is connected to the ground that has the reference potential of 0 V. The wire LNa2 however only has to be connected to a potential point having a potential that is fixed relative to the ground and, for example, may be connected to a potential point to which the reference voltage VCMREF is applied.

The wire LNa1 is connected to any point in the detection amplification circuit 20 through the switch SWa0 and, when the switch SWa0 is turned on, the capacitance between the wires LNa1 and LNa2 is inserted between this point and the ground.

The adjustment circuit 23 includes capacitors Cb1 to Cb4, switches SWb0 to SWb4, and wires LNb1 and LNb2. The wire LNb1 is connected to the wire LNb2 through a series circuit of the capacitor Cb1 and the switch SWb1, a series circuit of the capacitor Cb2 and the switch SWb2, a series circuit of the capacitor Cb3 and the switch SWb3, and a series circuit of the capacitor Cb4 and the switch SWb4. These four series circuits are connected in parallel to each other and the wire LNb1 is connected to the wire LNb2 through the circuit having therein the four series circuits that are connected in parallel to each other. The wire LNb2 is connected to the ground. The wire LNb2 however only has to be connected to a potential point that has a potential fixed relative to the ground and, for example, may be connected to a potential point to which the reference voltage VCMREF is applied.

The wire LNb1 is connected to any point in the detection amplification circuit 20 through the switch SWb0 and, when the switch SWb0 is turned on, the capacitance between the wires LNb1 and LNb2 is inserted between this point and the ground.

The switches described in this embodiment including the switches SWa0 to SWa4 and SWb0 to SWb4 are each include a semiconductor switching element such as a metal-oxide-semiconductor field-effect transistor (MOSFET) or a bipolar transistor. In this embodiment, "turning on of a switch" means that the conduction state of this switch is established (such as, for example, that the conduction state is established between the drain and the source of the MOSFET as the switch), and "turning off of a switch" means that non-conduction state of this switch is established (such as, for example, that the non-conduction state is established between the drain and the source of the MOSFET as the switch).

Turning on or turning off of each of the switches SWa0 to SWa4 is individually determined and controlled on the bases of a first adjustment signal supplied from the control circuit 14 included in the driver IC 10 (see FIG. 2A) to the adjustment circuit 22, and turning on or turning off of each of the switches SWb0 to SWb4 is individually determined and controlled on the basis of a second adjustment signal supplied from the control circuit 14 to the adjustment circuit 23. No problem arises when the first adjustment signal and the second adjustment signal are each a 5-bit digital signal.

The capacitances of the capacitors Ca1 to Ca4 may be equal to each other or may differ from each other. When the capacitances of the capacitors Ca1 to Ca4 are set to differ from each other, the number of adjustment levels of the capacitance between the wires LNa1 and LNa2 is increased. For example, the capacitances of the capacitors Ca1 to Ca4 can respectively be set to be 100 femtofarads (fF), 200 fF, 400 fF, and 800 fF and, in this case, the capacitance between the wires LNa1 and LNa2 can be adjusted from 0 to 1,500 fF by 100 fF, by turning on or off of each of the switches SWa1 to SWa4. In the above, a total of 15 unit capacitors each having a capacitance of 100 fF are disposed in the adjustment circuit 22, and one unit capacitor thereof can form the capacitor Ca1, a parallel circuit of other two unit capacitors thereof can form the capacitor Ca2, a parallel circuit of other four unit capacitors thereof can form the capacitor Ca3, and a parallel circuit of the other eight unit capacitors thereof can form the capacitor Ca4. Though the adjustment circuit 22 has the capacitor part whose capacitance is set to be variable disposed therein between the wires LNa1 and LNa2 as above, the capacitor part includes the capacitors Ca1 to Ca4 and the switches SWa1 to Swa4.

The capacitances of the capacitors Cb1 to Cb4 may be equal to each other or may differ from each other. When the capacitances of the capacitors Cb1 to Cb4 are set to differ from each other, the number of adjustment levels of the capacitance between the wires LNb1 and LNb2 is increased. For example, the capacitances of the capacitors Cb1 to Cb4 can respectively be set to be 100 fF, 200 fF, 400 fF, and 800 fF and, in this case, the capacitance between the wires LNb1 and LNb2 can be adjusted from 0 to 1,500 fF by 100 fF, by turning on or off of each of the switches SWb1 to SWb4. In the above, a total of 15 unit capacitors each having a capacitance of 100 fF are disposed in the adjustment circuit 23, and the one unit capacitor thereof can form the capacitor Cb1, a parallel circuit of other two unit capacitors thereof can form the capacitor Cb2, a parallel circuit of other four unit capacitors thereof can form the capacitor Cb3, and a parallel circuit of the other eight unit capacitors thereof can form the capacitor Cb4. Though the adjustment circuit 23 has the capacitor part whose capacitance is set to be variable disposed therein between the wires LNb1 and LNb2 as above, the capacitor part includes the capacitors Cb1 to Cb4 and the switches SWb1 to Swb4.

At a shipment adjustment step in the fabrication stage of the driver IC 10, it is fixedly determined for each of the switches SWa0 to SWa4 and SWb0 to SWb4 to be turned on or turned off. Turning on or turning off of each of the switches SWa0 to SWa4 and SWb0 to SWb4 may however set to be controllable on the basis of an instruction from the MPU 130 after the driver IC 10 is mounted on the HDD device 100.

The configurations, the operations, and the like of the above devices and the above circuits are referred to "Basic Example" for convenience. Detailed description, and application and modification techniques for the above devices and circuits will be described below in plural Examples. Without being especially described or without being inconsistent, the items described in the Basic Example are applied to the Examples described later. For the items inconsistent against the Basic Example in the Examples, the description therefor in the Examples is prioritized. Without being inconsistent, of the plural Examples described below, items described in any optional Example are applicable to other optional Examples (that is, two or more optional Examples of the plural Examples can be combined with each other). In addition, in the following, for substantiation of the description, specific values are presented in relation to resistance values, capacitance values, and the like while these values are only exemplifications and can naturally be variously varied.

First Example

Figure 7:
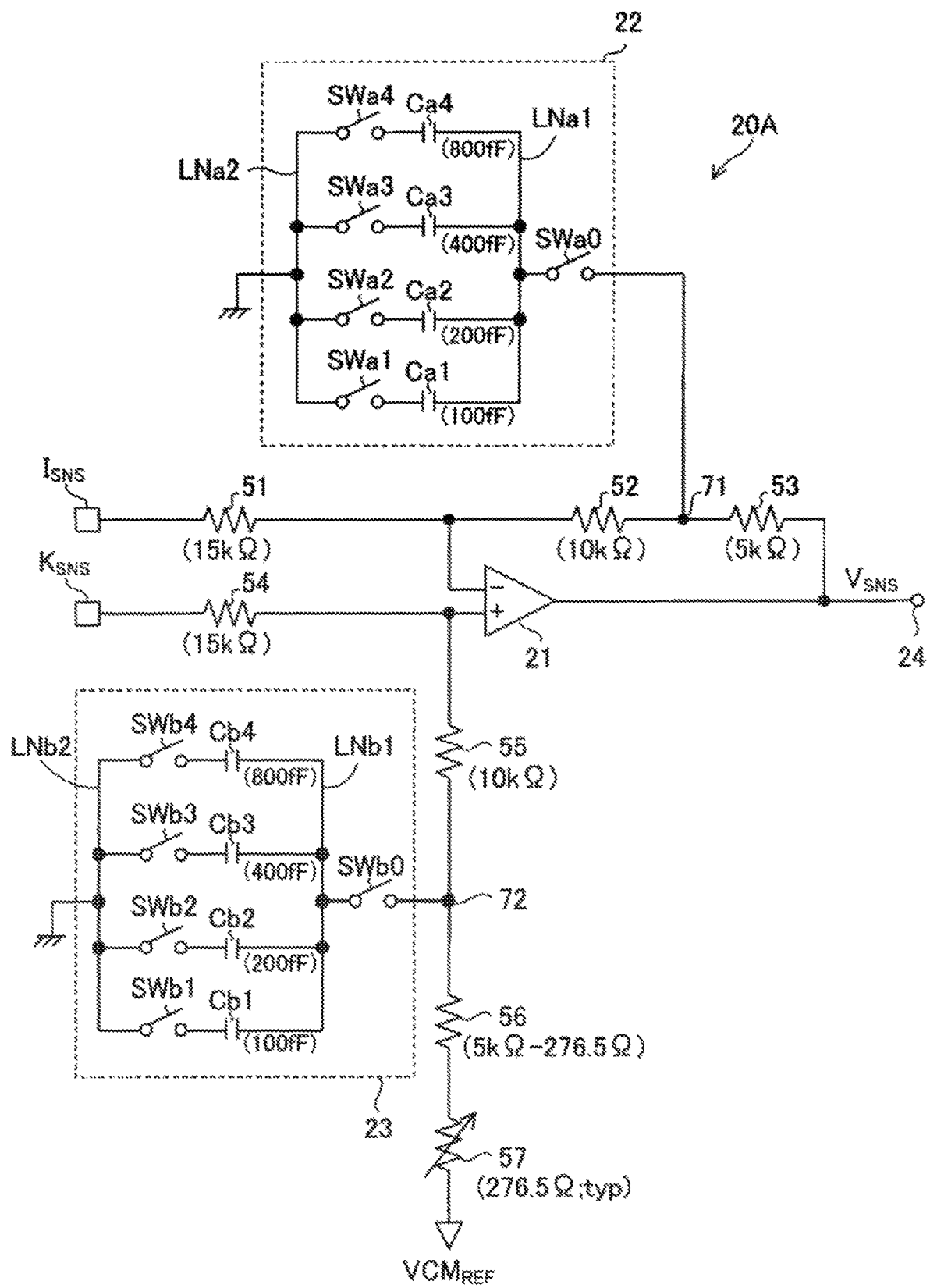
FIG. 7 is a circuit diagram of a detection amplification circuit according to a First Example of the present technology.

A First Example will be described. FIG. 7 is a circuit diagram of a detection amplification circuit 20A that is the detection amplification circuit 20 according to the First Example. The detection amplification circuit 20A includes the operating amplifier 21, resistors 51 to 56 that are fixed resistors, a variable resistor 57 including a digital potentiometer and the like, and the adjustment circuits 22 and 23.

In the detection amplification circuit 20A, the inverting input terminal of the operating amplifier 21 is connected to the terminal ISNS through the resistor 51 and, on the other hand, is connected to the output terminal of the operating amplifier 21 through a series circuit of the resistors 52 and 53. In the above, one end of the resistor 52 is connected to the inverting input terminal of the operating amplifier 21 and one end of the resistor 53 is connected to the output terminal of the operating amplifier 21. In the detection amplification circuit 20A, the output terminal of the operating amplifier 21 functions as the terminal 24 and the detected voltage VSNS is output from the operating amplifier 21.

In the detection amplification circuit 20A, the non-inverting input terminal of the operating amplifier 21 is connected to the terminal KSNS through the resistor 54 and, on the other hand, is connected to a potential point to which the reference voltage VCMREF is applied, through a series circuit of the resistor 55, the resistor 56, and the variable resistor 57. More specifically, one end of the resistor 55 is connected to the non-inverting input terminal of the operating amplifier 21, the other end of the resistor 55 is connected to one end of the resistor 56, the other end of the resistor 56 is connected to one end of the variable resistor 57, and the other end of the variable resistor 57 is connected to a potential point to which the reference voltage VCMREF is applied.

In the detection amplification circuit 20A, the wire LNa1 of the adjustment circuit 22 is connected to a connection node 71 between the resistors 52 and 53 (that is, the connection point of the resistor 52 and the resistor 53) through the switch SWa0, and the wire LNb1 of the adjustment circuit 23 is connected to a connection node 72 between the resistors 55 and 56 (that is, the connection point of the resistor 55 and the resistor 56) through the switch SWb0.

When the switch SWa0 is turned on, a filter is formed by the capacitors for which the corresponding switch in the adjustment circuit 22 is turned on and the resistors connected to the adjustment circuit 22 (the same is applied to the other Examples including the Second and the Third Examples described later). The filter formed using the capacitors in the adjustment circuit 22 influences the response of the output signal of the operating amplifier 21 to the fluctuation (the AC component) of the input signal into the terminal ISNS, and the frequency property of the output signal of the operating amplifier 21 for the in-phase AC signal input into the point between the terminals ISNS and KSNS can thereby be adjusted through adjustment of the property of this filter (that is, through adjustment of the capacitance between wires LNa1 and LNa2) (the same is applied to the other Examples including the Second and the Third Examples described later).

Similarly, when the switch SWb0 is turned on, a filter is formed by the capacitors for which the corresponding switch in the adjustment circuit 23 is turned on and the resistors connected to the adjustment circuit 23 (the same is applied to the other Examples including the Second and the Third Examples described later). The filter formed using the capacitors in the adjustment circuit 23 influences the response of the output signal of the operating amplifier 21 to the fluctuation (the AC component) of the input signal into the terminal KSNS, and the frequency property of the output signal of the operating amplifier 21 for the in-phase AC signal input into the point between the terminals ISNS and KSNS, can thereby be adjusted through adjustment of the property of this filter (that is, through adjustment of the capacitance between wires LNb1 and LNb2) (the same is applied to the other Examples including the Second and the Third Examples described later).

The adjustment of the frequency property of the output signal of the operating amplifier 21 for the in-phase AC signal input into the point between the terminals ISNS and KSNS adjusts the frequency property of the CMRR in the detection amplification circuit 20 (20A in the First Example). These adjustment sessions are realized on the basis of the first and the second adjustment signals from the control circuit 14. It can therefore be considered that the control circuit 14 realizes these adjustment sessions through the variable setting of the capacitance of the capacitor part disposed between the wires LNa1 and LNa2 or through the variable setting of the capacitance of the capacitor part disposed between the wires LNb1 and LNb2.

It is assumed in the above that, as a design example, in the detection amplification circuit 20A, the resistance values of the resistors 51 to 56 respectively are 15 kiloohms (kΩ), 10 kΩ, 5 kΩ, 15 kΩ, 10 kΩ, (5 kΩ to 276.5Ω), the capacitance values of the capacitors Ca1 and Cb1 are each 100 fF, the capacitance values of the capacitors Ca2 and Cb2 are each 200 fF, the capacitance values of the capacitors Ca3 and Cb3 are each 400 fF, and the capacitance values of the capacitors Ca4 and Cb4 are each 800 fF. It is assumed that the resistance value of the variable resistor 57 is variable relative to 276.5Ω.

Figure 8:
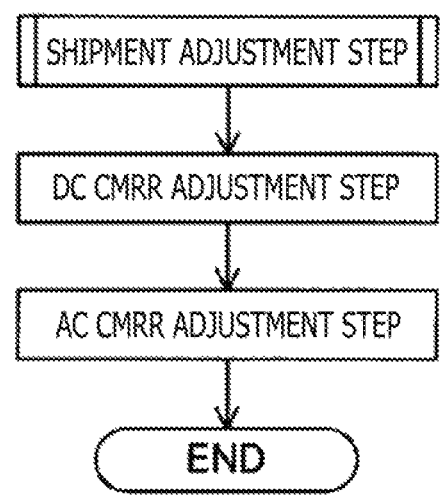
FIG. 8 is a flowchart of a shipment adjustment step according to the First Example of the present technology.

The shipment adjustment step in the fabrication stage of the driver IC 10 will be described with reference to FIG. 8. In the above, the shipment adjustment step described below is applicable to the other optional Examples described later not limiting to the First Example.

The shipment adjustment step includes a DC CMRR adjustment step and an AC CMRR adjustment step. The AC CMRR adjustment step is performed after the DC CMRR adjustment step.

At the DC CMRR adjustment step, the resistance value of the variable resistor 57 is adjusted and fixed such that the DC CMRR becomes as high as possible on the basis of the detected voltage VSNS in the state where a common DC voltage is applied to the terminals ISNS and KSNS. When the DC CMRR adjustment step is performed, the switches SWa0 to SWa4 and SWb0 to SWb4 are all turned off while a part or all of these switches may be turned on.

Figure 9:
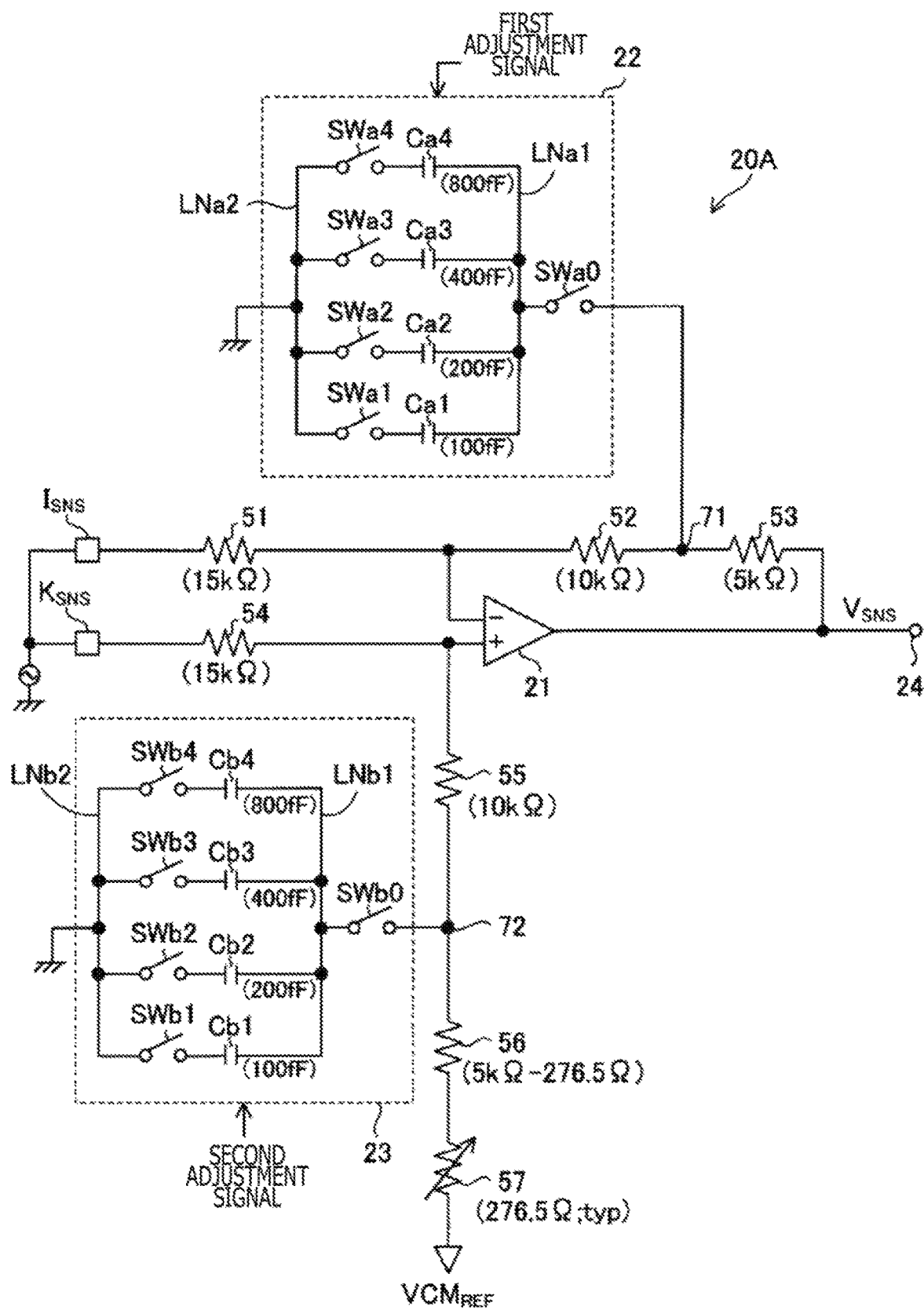
FIG. 9 is a diagram depicting a signal input state of the detection amplification circuit at an alternating current (AC) CMRR adjustment step according to the First Example of the present technology.

At the AC CMRR adjustment step, the combination of turning on or turning off of each of the switches SWa0 to SWa4 and SWb0 to SWb4 with which the AC CMRR becomes highest (hereinafter, referred to as "optimal combination") is sought on the basis of the detected voltage VSNS in the state where an in-phase AC voltage is applied to the terminals ISNS and KSNS (see FIG. 9). The digital signal values of the first and the second adjustment signals presenting the optimal combination is stored in the driver IC 10 in a non-volatile manner such as being stored in a non-volatile memory in the driver IC 10.

After the driver IC 10 is incorporated in the HDD device 100 after the AC CMRR adjustment step, the control circuit 14 only has to supply the first and the second adjustment signals having the stored digital signal values to the adjustment circuits 22 and 23 every time the driver IC 10 is started up.

An in-phase AC voltage having a predetermined test frequency is applied to the terminals ISNS and KSNS for each of the combinations of turning on or turning on of each of the switches SWa0 to SWa4 and SWb0 to SWb4, and the AC CMRR presented by each of the combinations is obtained. The combination presenting the highest AC CMRR only has to be determined as the optimal combination.

The CMRR is determined depending on the differential gain and the in-phase gain. To accurately obtain the AC CMRR for each of the combinations, when the in-phase AC voltage having the predetermined test frequency is applied to the terminals ISNS and KSNS, a predetermined differential voltage having the test frequency may therefore be superimposed thereon to be applied between the terminals ISNS and KSNS. The AC CMRR may however be obtained performing no superimposing application of the differential voltage and using the design value determined in advance as the differential gain of the detection amplification circuit 20 (20A in the First Example). Otherwise, performing no superimposing application of the differential voltage, the combination corresponding to the detected voltage VSNS having the smallest amplitude, of the detected voltages VSNS presented by the combinations may be regarded as the combination presenting the highest AC CMRR (that is, the optimal combination).

The test frequency may be one frequency determined in advance (such as, for example, 100 kHz), or may match with the PWM frequency. When the test frequency is one frequency, the optimal combination is determined on the basis of the AC CMRR at the one frequency for each of the combinations. In the case where the driver IC 10 is formed for the PWM frequency to be variable, a frequency included in the range for the PWM frequency to be variable in is advantageously set to be the test frequency.

Plural test frequencies may be employed. In this case, the PWM frequency is advantageously included in the plural test frequencies. Otherwise, the PWM frequency is advantageously be included between the maximal value and the minimal value of the plural test frequencies. The optimal combination is advantageously determined taking generally into consideration the AC CMRRs obtained with the plural test frequencies for each of the combinations. In the case where the driver IC 10 is formed for the PWM frequency to be variable, all or a part of the plural test frequencies are advantageously included in the range for the PWM frequency to be variable in.

The driver IC 10 has a communication external terminal disposed therein that is connected to the MPU 130 to enable interactive communication with the MPU 130 when the driver IC 10 is mounted on the HDD device 100, and the communication external terminal is connected to the IF circuit 13 (see FIG. 2A). At the shipment adjustment step, the communication external terminal is connected to a testing device (not depicted) and a dedicated command is supplied from the testing device to the driver IC 10 through the communication external terminal, and the DC CMRR adjustment step and the AC CMRR adjustment step are thereby enabled.

Figure 10:
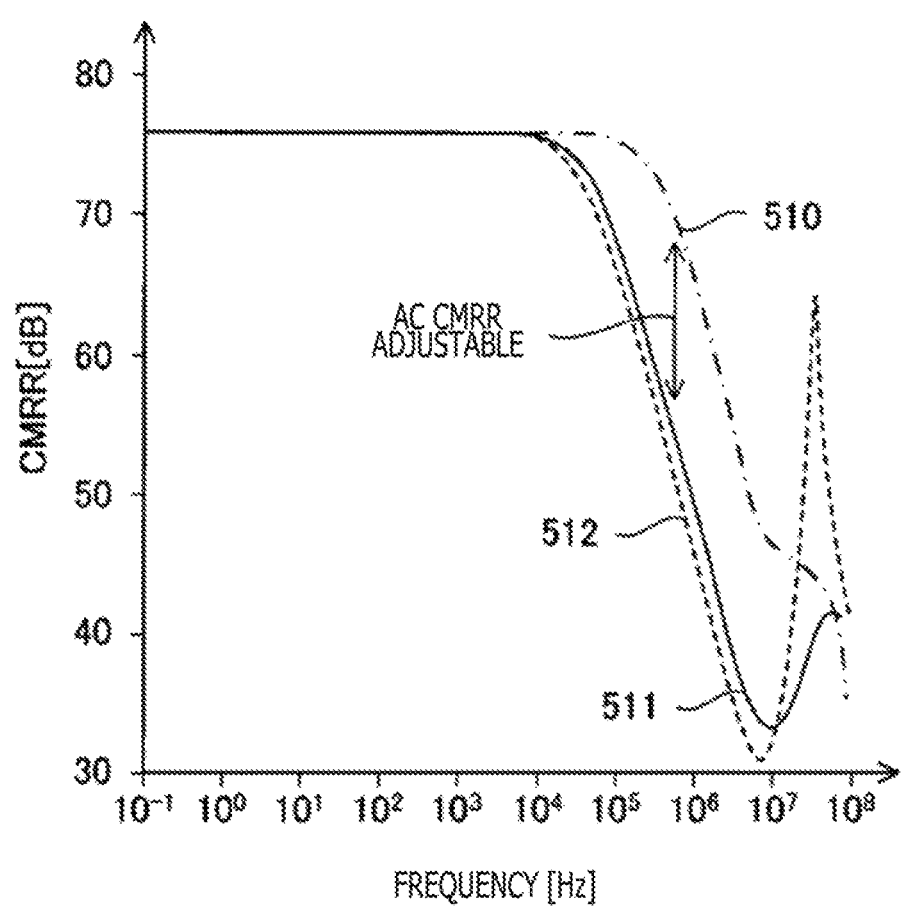
FIG. 10 is a graph depicting the fact that the CMRR of the detection amplification circuit can be adjusted using the adjustment circuit in the driver IC.
Figure 11:
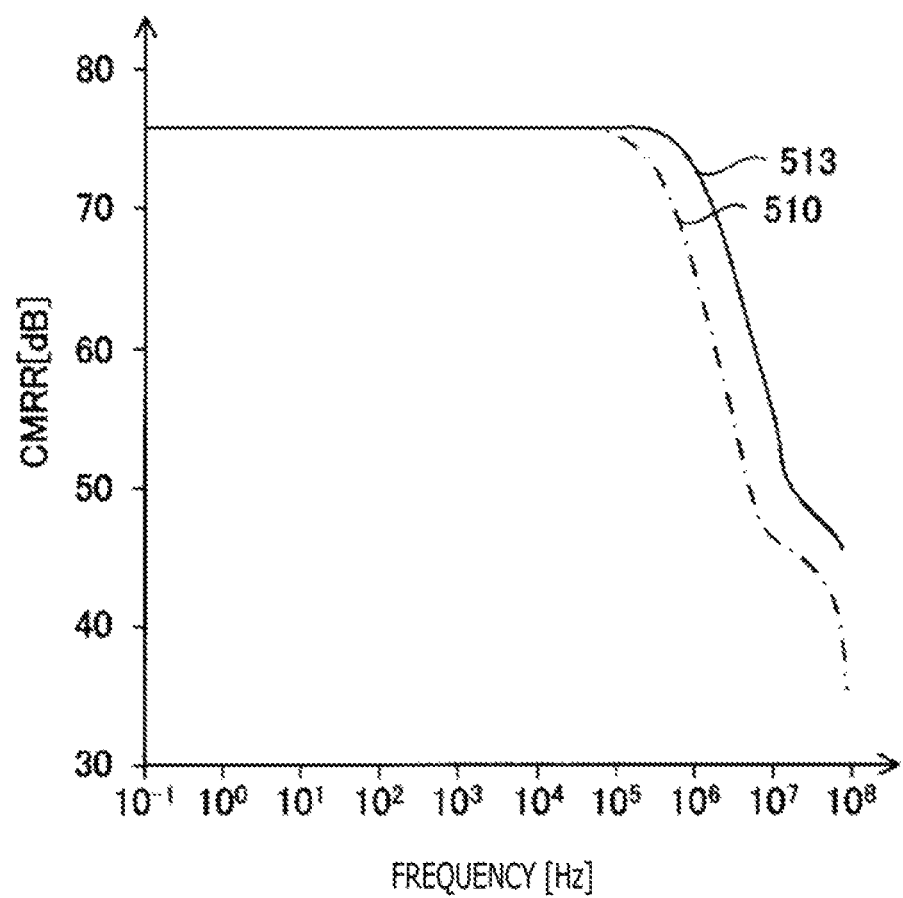
FIG. 11 is a graph depicting the fact that the CMRR of the detection amplification circuit can be adjusted using the adjustment circuit in the driver IC.

FIG. 10 depicts the frequency dependence of the CMRR obtained at the shipment adjustment step for one certain driver IC 10 for the test. A dashed-and-dotted line waveform 510 indicates the frequency dependency of the CMRR under a first adjustment condition under which the switches SWa0 to SWa4 and SWb0 to SWb4 are all turned off. A solid line waveform 511 indicates the frequency dependency of the CMRR under a second adjustment condition under which the switches SWa0 to SWa4 are all turned off and the switches SWb0 to SWb4 are all turned on. A dashed line waveform 512 indicates the frequency dependency of the CMRR under a third adjustment condition under which the switches SWa0 to SWa4 are all turned on and the switches SWb0 to SWb4 are all turned off. In a frequency band equal to or lower than approximately 10 kHz including a DC, the waveforms 510 to 512 overlap with each other (the same is applied to the waveforms 510 and 513 in FIG. 11). In other words, the resistance values and the capacitance values of the resistors and the capacitors constituting the detection amplification circuit 20 (20A in this case) are determined to establish the above.

The CMRR is reduced in accordance with an increase of the frequency in the frequency band exceeding 10 kHz or several 10 kHz while, in this frequency band, the filter that can be constituted including the capacitors of the adjustment circuit 22 and the filter that can be constituted including the capacitors of the adjustment circuit 23 conspicuously influence the operation of the detection amplification circuit 20 (20A in this case) and, as a result, a significant difference is generated in the CMRR among the first to the third adjustment conditions. This means that the adjustment of the AC CMRR is enabled by the adjustment circuits 22 and 23.

In the example in FIG. 10, the AC CMRR without being adjusted that corresponds to the waveform 510 is more excellent than the AC CMRR that corresponds to the waveform 511 or 512 while a contrary event may occur depending on the fabrication dispersion of the driver IC 10, and the like. In the case where the combination for the switches SWa0 to SWa4 and SWb0 to SWb4 to be all turned off is not the optimal combination, an AC CMRR more excellent than that without being adjusted can be obtained as indicated by the waveform 513 in FIG. 11 by the optimal combination.

Improvement of the precision of the positioning of the head 111 driven using the VCM 114 is facilitated by absorbing any degradation of the AC CMRR that may be generated by the fabrication dispersion of the driver IC 10 using the adjustment circuits 22 and 23.

In the above, as to the circuit configuration in FIG. 7, the resistor 56 and the variable resistor 57 are divided from each other while it can be considered that the resistor 56 and the variable resistor 57 constitute one variable resistor, and one variable resistor corresponding to the combined resistor of the resistor 56 and the variable resistor 57 may be disposed in the detection amplification circuit 20A instead of the resistor 56 and the variable resistor 57. In the case where only the function of adjusting the AC CMRR is considered, one fixed resistor may be disposed instead of the resistor 56 and the variable resistor 57.

Second Example

Figure 12:
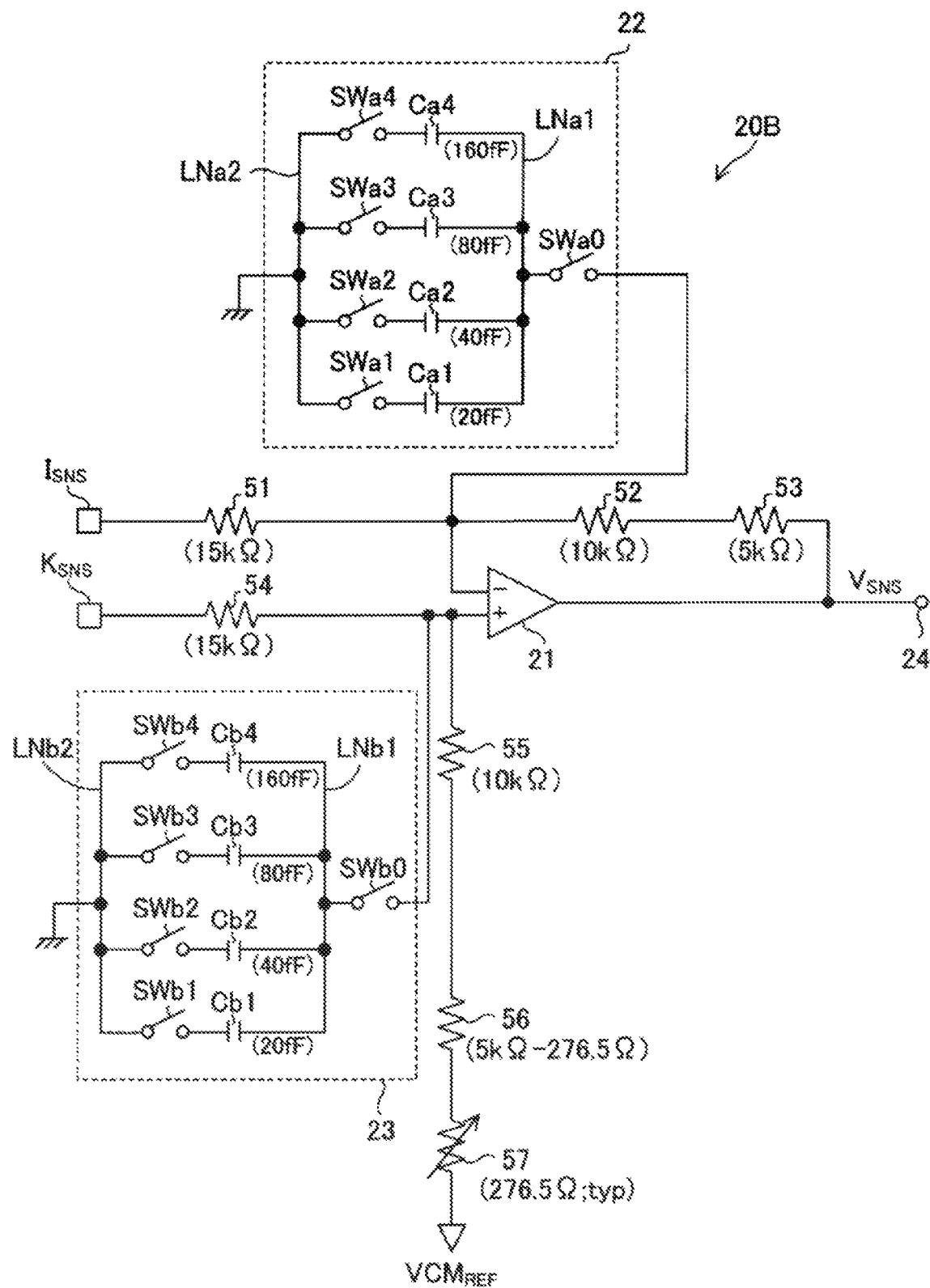
FIG. 12 is a circuit diagram of a detection amplification circuit according to a Second Example of the present technology.

A Second Example will be described. FIG. 12 is a circuit diagram of a detection amplification circuit 20B that is the detection amplification circuit 20 according to a Second Example. Similarly to the detection amplification circuit 20A in FIG. 7, the detection amplification circuit 20B includes the operating amplifier 21, the resistors 51 to 56 that are the fixed resistors, the variable resistor 57 including a digital potentiometer and the like, and the adjustment circuits 22 and 23.

Similarly to the detection amplification circuit 20A in FIG. 7, in the detection amplification circuit 20B, the output terminal of the operating amplifier 21 functions as the terminal 24 and the detected voltage VSNS is output from the operating amplifier 21. The connection relations of the inverting input terminal, the non-inverting input terminal, and the output terminal of the operating amplifier 21, the resistors 51 to 56, the variable resistor 57, the terminals ISNS and KSNS, and 24 are same between the detection amplification circuits 20A and 20B.

Different from the detection amplification circuit 20A in FIG. 7, in the detection amplification circuit 20B, the wire LNa1 of the adjustment circuit 22 is however connected to the inverting input terminal of the operating amplifier 21 through the switch SWa0 and not through any resistor, and the wire LNb1 of the adjustment circuit 23 is connected to the non-inverting input terminal of the operating amplifier 21 through the switch SWb0 and not through any resistor.

Similarly to the First Example, the frequency property of the output signal of the operating amplifier 21 for the in-phase AC signal input between the terminals ISNS and KSNS can therefore be adjusted through at least one adjustment of the adjustment of the capacitance between the wires LNa1 and LNa2 and the adjustment of the capacitance between the wires LNb1 and LNb2.

In the above, as a design example, similarly to the detection amplification circuit 20A in FIG. 7, in the detection amplification circuit 20B, the resistance values of the resistors 51 to 56 respectively are 15 kΩ, 10 kΩ, 5 kΩ, 15 kΩ, 10 kΩ, and (5 kΩ to 276.5Ω), and the resistance value of the variable resistor 57 is variable relative to 276.5Ω.

As to the example of these values, in the case where the property (including the adjustment capacity for the AC CMRR and the AC CMRR) at the same level of that of the detection amplification circuit 20A is desired to be imparted to the detection amplification circuit 20B, the capacitance values of the capacitors in the adjustment circuits 22 and 23 however need to be reduced to be approximately ⅕ of those of the detection amplification circuit 20A. For the detection amplification circuit 20B, therefore, for example, the capacitance values of the capacitors Ca1 and Cb1 are each 20 fF, the capacitance values of the capacitors Ca2 and Cb2 are each 40 fF, the capacitance values of the capacitors Ca3 and Cb3 are each 80 fF, and the capacitance values of the capacitors Ca4 and Cb4 are each 160 fF.

When the capacitance of a capacitor is reduced, the influence of the fabrication error on the target value of the capacitance becomes correspondingly significant, and the property of the filter constituted using the adjustment circuits 22 and 23 is correspondingly shifted from the designed target. Taking into consideration the fabrication error of the capacitance, it can be stated that the detection amplification circuit 20A is more advantageous than the detection amplification circuit 20B. Otherwise, the detection amplification circuit 20A may be more advantageous than the detection amplification circuit 20B. It is however possible to reduce the influence of the fabrication error of the capacitances by varying the resistance values of the resistors constituting the detection amplification circuit 20B from those described above.

In the above, in the detection amplification circuit 20B in FIG. 12, the resistor 52 and the resistor 53 can be integrated into one resistor, and the resistor 55 and the resistor 56 can be integrated into one resistor, and it can also be considered that the resistor 55, the resistor 56, and the variable resistor 57 constitute one variable resistor. In the case where only the function of adjusting the AC CMRR is considered, one fixed resistor may be disposed instead of the resistor 55, the resistor 56 and the variable resistor 57.

Third Example

Figure 13:
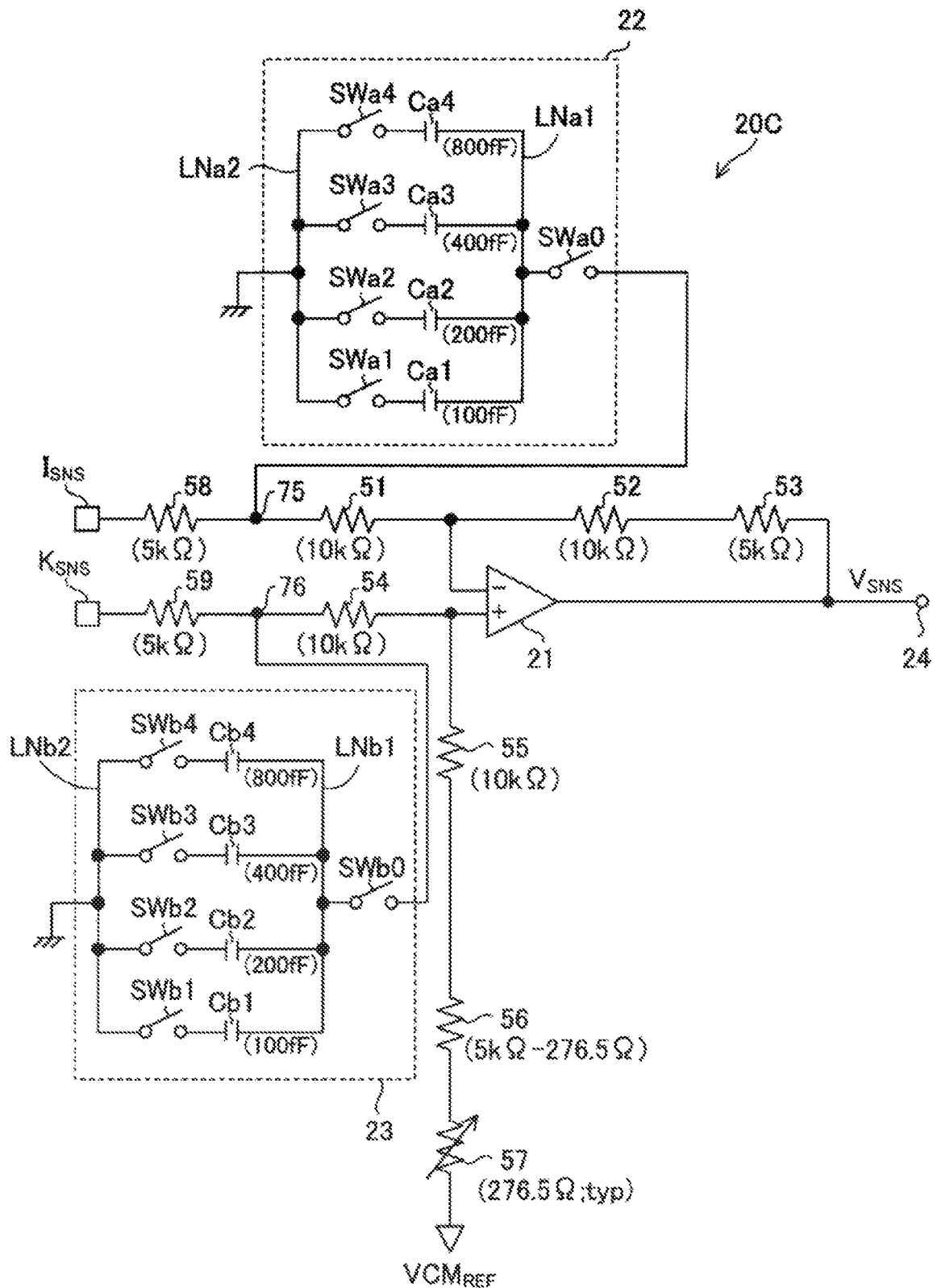
FIG. 13 is a circuit diagram of a detection amplification circuit according to a Third Example of the present technology.

A Third Example will be described. FIG. 13 is a circuit diagram of a detection amplification circuit 20C that is the detection amplification circuit 20 according to the Third Example. The detection amplification circuit 20C includes the operating amplifier 21, the resistors 51 to 56, 58, and 59 that are fixed resistors, the variable resistor 57 including a digital potentiometer and the like, and the adjustment circuits 22 and 23.

In the detection amplification circuit 20C, the inverting input terminal of the operating amplifier 21 is connected to the terminal ISNS through a series circuit of the resistors 51 and 58 and, on the other hand, is connected to the output terminal of the operating amplifier 21 through a series circuit of the resistors 52 and 53. In this case, both the one end of the resistor 51 and the one end of the resistor 52 are connected to the inverting input terminal of the operating amplifier 21, the other end of the resistor 51 is connected to the terminal ISNS through the resistor 58, and the other end of the resistor 52 is connected to the output terminal of the operating amplifier 21 through the resistor 53. In the detection amplification circuit 20C, the output terminal of the operating amplifier 21 functions as the terminal 24 and the detected voltage VSNS is output from the operating amplifier 21.

In the detection amplification circuit 20C, the non-inverting input terminal of the operating amplifier 21 is connected to the terminal KSNS through a series circuit of the resistors 54 and 59 and, on the other hand, is connected to a potential point to which the reference voltage VCMREF is applied, through a series circuit of the resistor 55, the resistor 56, and the variable resistor 57. More specifically, both the one end of the resistor 54 and the one end of the resistor 55 are connected to the non-inverting input terminal of the operating amplifier 21, the other end of the resistor 54 is connected to the terminal KSNS through the resistor 59, the other end of the resistor 55 is connected to the one end of the resistor 56, and the other end of the resistor 56 is connected to the variable resistor 57, and the other end of the variable resistor 57 is connected to the potential point to which the reference voltage VCMREF is applied.

In the detection amplification circuit 20C, the wire LNa1 of the adjustment circuit 22 is connected to a connection node 75 between the resistors 58 and 51 (that is, the connection point of the resistor 58 and the resistor 51) through the switch SWa0, and the wire LNb1 of the adjustment circuit 23 is connected to a connection node 76 between the resistors 59 and 54 (that is, the connection point of the resistor 59 and the resistor 54) through the switch SWb0.

Similarly to the First Example, the frequency property of the output signal of the operating amplifier 21 for the in-phase AC signal input between the terminals ISNS and KSNS can therefore be adjusted through at least one adjustment of the adjustment of the capacitance between the wires LNa1 and LNa2 and the adjustment of the capacitance between the wires LNb1 and LNb2.

It is assumed in the above that, as a design example, in the detection amplification circuit 20C, the resistance values of the resistors 51 to 56, 58, and 59 respectively are 10 kΩ, 10 kΩ, 5 kΩ, 10 kΩ, 10 kΩ, (5 kΩ to 276.5Ω), 5 kΩ, and 5 kΩ, and the resistance value of the variable resistor 57 is variable relative to 276.5Ω. It is also assumed that the capacitances of the capacitors in the adjustment circuits 22 and 23 are equal to those listed in the First Example (100 fF, 200 fF, 400 fF, and 800 fF). As a result, the property (including the adjustment capacity for the AC CMRR and the AC CMRR) at the equal level of that of the detection amplification circuit 20A according to the First Example can be imparted to the detection amplification circuit 20C.

As only an example of the values, the voltages of the terminals ISNS and KSNS each fluctuate in a range from 0 to 12 V in the HDD device 100 including the driver IC 10 while the HDD device 100 is designed for the detected voltage VSNS to fluctuate from (VCMREF−0.6 V) to (VCMREF+0.6 V). In the above, it is assumed that the VCMREF is 0.75 V. As a result, in the detection amplification circuit 20A in FIG. 7 whose adjustment circuits 22 and 23 are arranged close to the output side of the operating amplifier 21, the withstanding voltage of each of the switches in the adjustment circuits 22 and 23 is satisfactorily approximately 5 V. On the other hand, in the detection amplification circuit 20C in FIG. 13 whose adjustment circuits 22 and 23 are arranged close to the input side of the operating amplifier 21, the necessity is generated to set the withstanding voltage of each of the switches in the adjustment circuits 22 and 23 to be higher than that of the detection amplification circuit 20A by the amount necessary due to a signal at a relatively higher voltage level applied to the adjustment circuits 22 and 23 than that for the detection amplification circuit 20A. Taking this into consideration, it can be stated that the detection amplification circuit 20A is more advantageous than the detection amplification circuit 20C. Otherwise, the detection amplification circuit 20A may be more advantageous than the detection amplification circuit 20C.

This context however depends on the input voltage level and the output voltage level of the detection amplification circuit 20 and, assuming that a device including the detection amplification circuit 20 is designed such that the input voltage level and the output voltage level of the detection amplification circuit 20 are substantially equal, no difference is generated in the superiority relating to the necessary withstanding voltage of each of the switches between the amplification circuits 20A and 20C, and employment of the detection amplification circuit 20C may be more advantageous than that of the detection amplification circuit 20A depending on the circumstances.

In addition, in the detection amplification circuit 20C in FIG. 13, the resistor 52 and the resistor 53 can be integrated into one resistor, and the resistor 55 and the resistor 56 can be integrated into one resistor, and it can also be considered that the resistor 55, the resistor 56, and the variable resistor 57 constitute one variable resistor. In the case where only the function of adjusting the AC CMRR is considered, one fixed resistor may be disposed instead of the resistor 55, the resistor 56 and the variable resistor 57.

Fourth Example

A Fourth Example will be described. The improvement of the AC CMRR is facilitated by using the adjustment circuits 22 and 23 while, even when the adjustment by each of the adjustment circuits 22 and 23 is optimized, depending on the performance limit of the operating amplifier 21 and the like, the AC CMRR in the correspondingly high frequency band (such as, for example, a frequency band equal to 100 kHz or higher) is significantly low. In the switching portion of the switching voltage (corresponding to the portion of 100 V/μsec in FIG. 5), an AC signal component at a frequency higher than the PWM frequency is included and, when possible, it is preferred that a high AC CMRR can be realized also for this high frequency component.

In the detection amplification circuit 20 according to the Fourth Example, a lowpass filter (hereinafter, may be referred to as "LPF") is disposed on the output side of the operating amplifier 21 and a signal obtained by attenuating the high-frequency component of the output signal of the operating amplifier 21 by the LPF is output from the internal output terminal 24.

Figure 14:
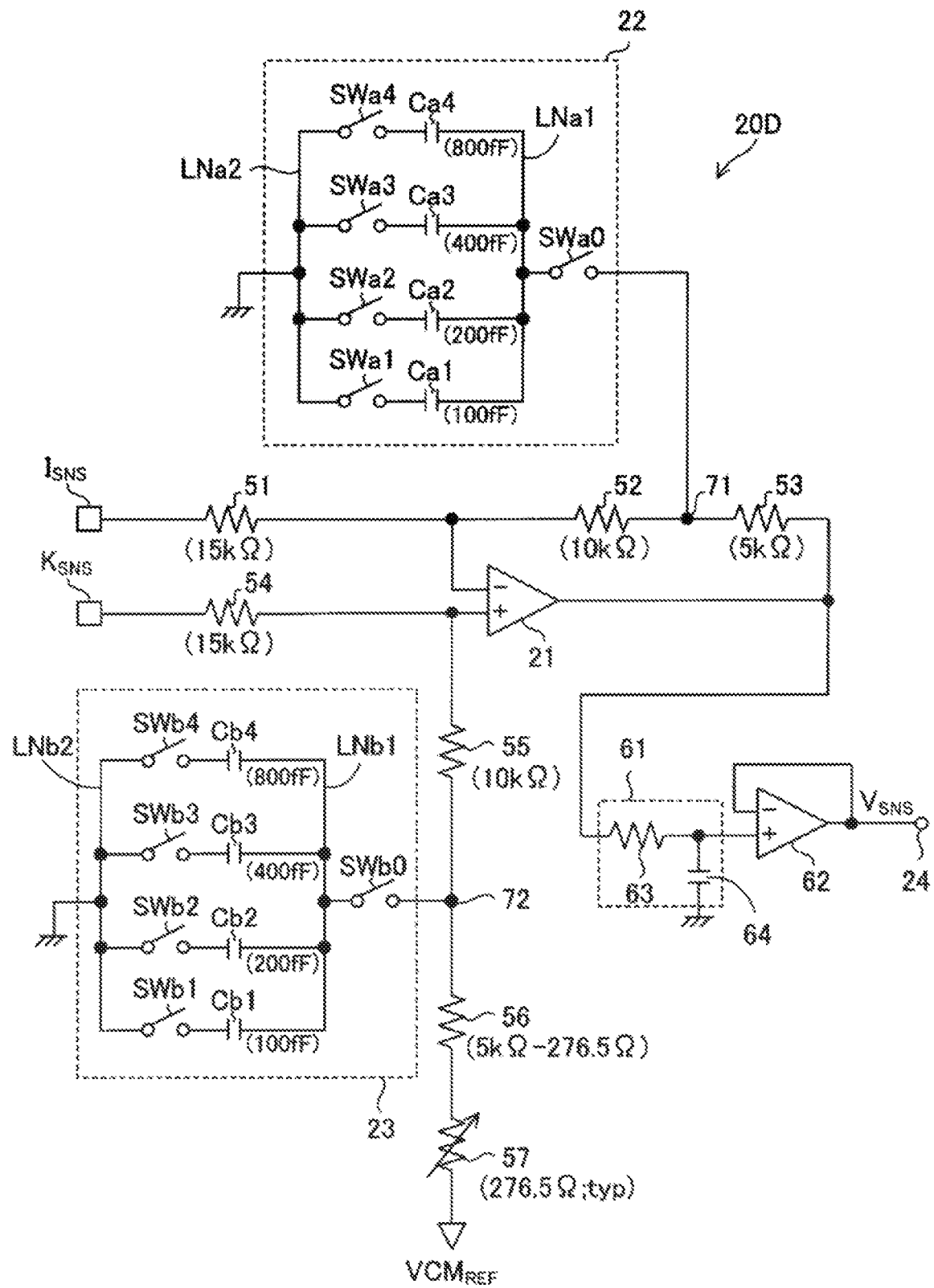
FIG. 14 is a circuit diagram of a detection amplification circuit according to a Fourth Example of the present technology.
Figure 15:
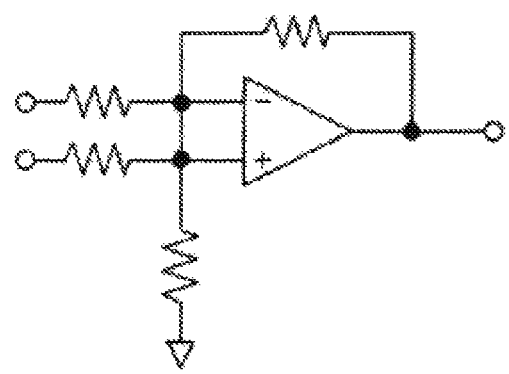
FIG. 15 is a diagram depicting a related-art differential amplification circuit.

FIG. 14 depicts a circuit diagram of a detection amplification circuit 20D that is the detection amplification circuit 20 according to the Fourth Example. The detection amplification circuit 20D has the circuit formed by adding the LPF 61 and a buffer circuit 62 to the detection amplification circuit 20A according to the First Example.

The LPF 61 is connected to the output terminal of the operating amplifier 21. The LPF 61 causes the DC component and the low-frequency component (that is, the signal component whose frequencies are relatively low) included in the output signal of the operating amplifier 21 to pass therethrough and attenuates the high-frequency component (that is, the signal component whose frequencies are relatively high). The LPF 61 is arranged between the output terminal of the operating amplifier 21 and the buffer circuit 62, and the buffer circuit 62 impedance-converts the signal obtained from the LPF 61 (that is, the output signal of the operating amplifier 21 whose high-frequency component is attenuated by the LPF 61) and outputs the signal obtained by the impedance-conversion from the internal output terminal 24. In the detection amplification circuit 20D, the voltage presented by the output signal of the buffer circuit 62 therefore functions as the detected voltage VSNS. The buffer circuit 62 has sufficiently high input impedance and also has sufficiently low output impedance, and thereby realizes the impedance-conversion.

More specifically, for example, as depicted in FIG. 14, the LPF 61 includes a resistor 63 and a capacitor 64, and the buffer circuit 62 includes an operating amplifier forming a voltage follower (therefore, in the following, the operating amplifier as the buffer circuit 62 will be referred to as "operating amplifier 62"). In this case, the output terminal of the operating amplifier 21 is connected to the non-inverting input terminal of the operating amplifier 62 through the resistor 63, a connection node of the resistor 63 and the non-inverting input terminal of the operating amplifier 62 is connected to the ground through the capacitor 64, and both the inverting input terminal and the output terminal of the operating amplifier 62 are connected to the internal output terminal 24. As a result, the output signal of the operating amplifier 21 whose high-frequency component is attenuated by the LPF 61 is added to the non-inverting input terminal of the operating amplifier 62 and a signal obtained by amplifying the signal added to the non-inverting input terminal of the operating amplifier 62 at the voltage gain of 0 dB is output from the internal output terminal 24.

For example, in the case where, for the output signal of the operating amplifier 21, an excellent AC CMRR can be obtained at 300 kHz or lower and, on the other hand, conspicuous degradation of the AC CMRR is observed at around a frequency exceeding 300 kHz, the cut-off frequency of the LPF 61 is only has to be set to be 300 kHz or a frequency around 300 kHz. The AC CMRR of the overall detection amplification circuit 20D is thereby sufficiently high even in the frequency band exceeding 300 kHz.

The configuration formed by adding the LPF 61 and the buffer circuit 62 to the detection amplification circuit 20A according to the First Example has been described with reference to FIG. 14 while the LPF 61 and the buffer circuit 62 can also be added to the detection amplification circuit 20B according to the Second Example or the detection amplification circuit 20C according to the Third Example. The connection relations of the operating amplifier 21, the LPF 61, the buffer circuit 62, and the internal output terminal 24 in the detection amplification circuit 20B or 20C after the addition is completed are same as those of the detection amplification circuit 20D.

Fifth Example

A Fifth Example will be described. The switches SWa0 to SWa4 of the adjustment circuit 22 and the switches SWb0 to SWb4 of the adjustment circuit 23 are turned off in their default state. The switch SWa0 is turned on in response to the fact that the first adjustment signal instructing turning on of the switch SWa0 is supplied to the adjustment circuit 22, and the switch SWb0 is turned on in response to the fact that the second adjustment signal instructing turning on of the switch SWb0 is supplied to the adjustment circuit 23. The same is applied to each of the switches SWa1 to SWa4 and the switches SWb1 to SWb4.

In the default state such as the state immediately after the starting up of the driver IC 10, the wires LNa1 and LNb1 are each in a floating state. To avoid this floating state, a first potential stabilizing switch and a second potential stabilizing switch may be disposed respectively between the wire LNa1 and the ground and between the wire LNb1 and the ground. The first potential stabilizing switch is turned on and off respectively when the switch SWa0 is turned off and on. The second potential stabilizing switch is turned on and off respectively when the switch SWb0 is turned off and on.

Sixth Example

A Sixth Example will be described. Only the adjustment circuit 22 of the adjustment circuits 22 and 23 may be disposed or only the adjustment circuit 23 thereof may be disposed in the detection amplification circuit 20 (such as, for example, the detection amplification circuit 20A, 20B, 20C, or 20D). This is because the case where the adjustment necessary for the optimization of the AC CMRR can be realized by only disposing only one adjustment circuit of the adjustment circuits 22 and 23 may be present depending on the layout pattern or the like of the internal circuit and the peripheral circuits of the operating amplifier 21.

In the case where only the adjustment circuit 22 of the adjustment circuits 22 and 23 is disposed in the detection amplification circuit 20, the combination of turning on and turning off of each of the switches SWa0 to SWa4 with which the AC CMRR of the detection amplification circuit 20 becomes highest only has to be sought as the optimal combination. Similarly, in the case where only the adjustment circuit 23 of the adjustment circuits 22 and 23 is disposed in the detection amplification circuit 20, the combination of turning on and turning off of each of the switches SWb0 to SWb4 with which the AC CMRR of the detection amplification circuit 20 becomes highest only has to be sought as the optimal combination.

Seventh Example

A Seventh Example will be described. The switches SWa0 and SWb0 may be excluded from the adjustment circuits 22 and 23. When the switch SWa0 is excluded, the points between which conduction and non-conduction are switched therebetween through the switch SWa0 are short-circuited to each other. The same is applied to the switch SWb0. In the case where the switches SWa0 and SWb0 are excluded, the wires LNa1 and LNb1 are therefore directly connected respectively to the nodes 71 and 72 in the configuration in FIG. 7, are directly connected respectively to the inverting input terminal and the non-inverting input terminal of the operating amplifier 21 in the configuration in FIG. 12, and are directly connected respectively to the nodes 75 and 76 in the configuration in FIG. 13.

Eighth Example

An Eighth Example will be described. The configuration for the capacitance between the wires LNa1 and LNa2 in the adjustment circuit 22 to be adjustable at 16 levels is described above while the number of the adjustment levels of the capacitance between the wires LNa1 and LNa2 is optional only when the number of the adjustment levels is two or more. Similarly, the number of the adjustment levels of the capacitance between the wires LNb1 and LNb2 is optional only when the number of the adjustment levels is two or more.

Ninth Example

A Ninth Example will be described. The constituent elements of the driver IC 10 are formed in the form of a semiconductor integrated circuit, and the semiconductor integrated circuit is sealed in a housing (a package) that includes a resin, to thereby constitute a semiconductor device. A circuit equivalent to the circuit in the driver IC 10 may be constituted using plural discrete parts.

Tenth Example

A Tenth Example will be described.

It is assumed in this embodiment that the VCM 114 is used in the HDD device 100 while the use of the VCM 114 is optional. For example, the VCM 114 may be used for driving the lens of a digital camera.

It is assumed in this embodiment that the VCM 114 is included in the load for the driver IC 10 while the load for the driver IC 10 (that is, the load receiving the supply of the current IOUT from the driver IC 10) may be an optional load and may therefore be a load other than a motor.

The amplification circuit according to the present technology embodied as the detection amplification circuit 20 may be incorporated in an optional circuit or an optional device that needs signal amplification. Excellent AC CMRR is naturally necessary for each of amplification circuits for various uses.

For example, the amplification circuit according to the present technology may be used in a circuit that amplifies an acoustic signal input thereinto through a first and a second input terminals. Otherwise, for example, the amplification circuit according to the present technology may be incorporated in a switching power source circuit, a voltage signal representing an output current to the load of the power source circuit may be input into the first and the second input terminals of the amplification circuit according to the present technology, and the output current may highly precisely be detected from the output signal of the amplification circuit. The first and the second input terminals of the amplification circuit of the present technology respectively correspond to the terminals ISNS and KSNS or respectively correspond to the terminals KSNS and ISNS of the detection amplification circuit 20.

Referring to a potential point connected to the wire LNa2 as "potential point PPX," a potential point connected to the wire LNb2 as "potential point PPY," and a potential point connected to one end different from the one end connected to the resistor 56 of the ends of the variable resistor 57 as "potential point PPZ," it is assumed in the above embodiment that, mainly, the potential points PPX and PPY have the reference potential of 0 V and the potential point PPZ has a potential different from 0 V (the reference voltage VCM-REF), while the potential points PPX, PPY, and PPZ are optional only when these are potential points that each have a potential fixed relative to the ground. For example, the potential at the potential point PPZ (the reference voltage VCMREF) may therefore be 0 V. The potentials that the potential points PPX, PPY, and PPZ have may all be equal to each other, may all be different from each other, or any optional two potentials of the potentials that the potential points PPX, PPY, and PPZ have may be equal to each other and the remaining one potential may be different from the potential of the two potential points.

The semiconductor integrated circuit formed by integrating the single body of the amplification circuit according to the present technology may be sealed in a housing (a package) that includes a resin and a semiconductor device of the amplification circuit may thereby be constituted.

<<Consideration for Present Technology>>

Consideration will be presented for the present technology embodied by the above embodiment.

An amplification circuit W0 (20, and 20A to 20D) according to the present technology is an amplification circuit that outputs an output signal (VSNS) formed by amplifying the differential signal between a first input terminal and a second input terminal using an operating amplifier (21) and plural resistors, includes adjustment circuits (22 and 23) to adjust the frequency property of the output signal for an in-phase AC signal input into a point between the first input terminal and the second input terminal, and is characterized in that the adjustment circuits are each connected to the one input terminal of the first input terminal and the second input terminal through one or more resistors, the adjustment circuits each include a capacitor part whose capacitance is set to be variable, and the adjustment is realized through variable setting of the capacitance of the capacitor part.

Any degradation of the CMRR that may be generated by fabrication dispersion and the like can thereby be corrected to the optimal one.

In an amplification circuit W1 that is one form of the amplification circuit W0, for example, the inverting input terminal of the operating amplifier is connected to the one input terminal (ISNS) through a first resistor (51) and is also connected to an output terminal of the operating amplifier through a series circuit of a second resistor and a third resistor (52 and 53), a non-inverting input terminal of the operating amplifier is input with a signal based on a signal at the other input terminal (KSNS) of the first input terminal and the second input terminal, and the adjustment circuit (22) is inserted between a connection node (71) between the second resistor and the third resistor and a predetermined potential point (such as, for example, the ground).

Otherwise, in the amplification circuit W1, for example, the non-inverting input terminal of the operating amplifier is connected to the one input terminal (KSNS) through the first resistor (54) and is also connected to a predetermined first potential point (VCMREF) through a series circuit of the second resistor and the third resistor (55 to 57), the inverting input terminal of the operating amplifier is input with a signal based on a signal at the other input terminal (ISNS) of the first input terminal and the second input terminal, and the adjustment circuit (23) is inserted between a connection node (72) between the second resistor and the third resistor and a predetermined second potential point (such as, for example, the ground).

Moreover, otherwise, in the amplification circuit W1, for example, the first adjustment circuit and the second adjustment circuit (22 and 23) each including a capacitor part whose capacitance is set to be variable are disposed as the adjustment circuit, the inverting input terminal of the operating amplifier is connected to the first input terminal (ISNS) through the first resistor (51) and is also connected to the output terminal of the operating amplifier through a series circuit of the second resistor and the third resistor (52 and 53), the first adjustment circuit (22) is inserted between the connection node (71) between the second resistor and the third resistor, and the predetermined first potential point (such as, for example, the ground), the non-inverting input terminal of the operating amplifier is connected to the second input terminal (KSNS) through the fourth resistor (51) and is also connected to a predetermined second potential point (VCMREF) through a series circuit of the fifth resistor and the sixth resistor (55 to 57), and the second adjustment circuit (23) is inserted between the connection node (72) between the fifth resistor and the sixth resistor, and a predetermined third potential point (such as, for example, the ground).

In the amplification circuit W1, the first resistor to the sixth resistor may each be formed by an optional number to be one or more of resistors (for example, it can be considered that the sixth resistor is formed by the resistors 56 and 57 in the circuit in FIG. 7).

In an amplification circuit W2 that is another form of the amplification circuit W0, for example, the inverting input terminal of the operating amplifier is connected to the one input terminal (ISNS) through the first resistor (51) and is also connected to the output terminal of the operating amplifier through the second resistor (52 and 53), the non-inverting input terminal of the operating amplifier is input with a signal based on a signal at the other input terminal (KSNS) of the first input terminal and the second input terminal, and the adjustment circuit (22) is inserted between the inverting input terminal of the operating amplifier and a predetermined potential point (such as, for example, the ground).

Otherwise, in the amplification circuit W2, for example, the non-inverting input terminal of the operating amplifier is connected to the one input terminal (KSNS) through the first resistor (54) and is also connected to a predetermined first potential point (VCMREF) through the second resistor (55 to 57), the inverting input terminal of the operating amplifier is input with a signal based on a signal at the other input terminal (ISNS) of the first input terminal and the second input terminal, and the adjustment circuit (23) is inserted between the non-inverting input terminal of the operating amplifier and a predetermined second potential point (such as, for example, the ground).

Moreover, otherwise, in the amplification circuit W2, for example, a first adjustment circuit and a second adjustment circuit (22 and 23) each including a capacitor part whose capacitance is set to be variable are disposed as the adjustment circuit, the inverting input terminal of the operating amplifier is connected to the first input terminal (ISNS) through the first resistor (51) and is also connected to the output terminal of the operating amplifier through the second resistor (52 and 53), the first adjustment circuit (22) is inserted between the inverting input terminal of the operating amplifier and the predetermined first potential point (such as, for example, the ground), the non-inverting input terminal of the operating amplifier is connected to the second input terminal (KSNS) through the third resistor (54) and is also connected to a predetermined second potential point (VCMREF) through the fourth resistor (55 to 57), and the second adjustment circuit (23) is inserted between the non-inverting input terminal of the operating amplifier and a predetermined third potential point (such as, for example, the ground).

In the amplification circuit W2, the first resistor to the fourth resistor may each be formed by an optional number to be one or more of resistors (for example, it can be considered that the fourth resistor is formed by the resistors 55 to 57 in the circuit in FIG. 12).

In an amplification circuit W3 that is yet another form of the amplification circuit W0, for example, the inverting input terminal of the operating amplifier is connected to the one input terminal (ISNS) through a series circuit of the first resistor and the second resistor (51 and 58) and is also connected to the output terminal of the operating amplifier through the third resistor (52 and 53), the non-inverting input terminal of the operating amplifier is input with a signal based on a signal at the other input terminal (KSNS) of the first input terminal and the second input terminal, and the adjustment circuit (22) is inserted between a connection node (75) between the first resistor and the second resistor, and a predetermined potential point (such as, for example, the ground).

Otherwise, in the amplification circuit W3, for example, the non-inverting input terminal of the operating amplifier is connected to the one input terminal (KSNS) through a series circuit of the first resistor and the second resistor (54 and 59) and is also connected to a predetermined first potential point (VCMREF) through the third resistor (55 to 57), the inverting input terminal of the operating amplifier is input with a signal based on a signal at the other input terminal (ISNS) of the first input terminal and the second input terminal, and the adjustment circuit (23) is inserted between a connection node (76) between the first resistor and the second resistor, and the predetermined second potential point (such as, for example, the ground).

Moreover, otherwise, in the amplification circuit W2, for example, a first adjustment circuit and a second adjustment circuit (22 and 23) each including a capacitor part whose capacitance is set to be variable are disposed as the adjustment circuit, the inverting input terminal of the operating amplifier is connected to the first input terminal (ISNS) through a series circuit of the first resistor and the second resistor (51 and 58) and is also connected to the output terminal of the operating amplifier through the third resistor (52 and 53), the first adjustment circuit (22) is inserted between a connection node (75) between the first resistor and the second resistor, and the predetermined first potential point (such as, for example, the ground), the non-inverting input terminal of the operating amplifier is connected to the second input terminal (KSNS) through a series circuit of the fourth resistor and the fifth resistor (54 and 59) and is connected to the predetermined second potential point (VCMREF) through the sixth resistor (55 to 57), and the second adjustment circuit (23) is inserted between the connection node (76) between the fourth resistor and the fifth resistor, and a predetermined third potential point (such as, for example, the ground).

In the amplification circuit W3, the first resistor to the sixth resistor may each be formed by an optional number to be one or more of resistors (for example, it can be considered that the sixth resistor is formed by the resistors 55 to 57 in the circuit in FIG. 13).

The embodiment of the present technology can variously be changed as necessary within the scope of the technical idea described in the appended claims. The above embodiment is absolutely an example of the embodiment of the present technology, and the present technology and the meaning of the words for the constituent elements thereof are not limited to those described in the above embodiment. The specific values presented in the above description are only exemplified and can each be naturally varied to various values.

The present technology contains subject matter related to that disclosed in Japanese Priority Patent Application JP 2017-246330 filed in the Japan Patent Office on Dec. 22, 2017, the entire content of which is hereby incorporated by reference.

What is claimed is:

1. An amplification circuit that outputs an output signal formed by amplifying a differential signal between a first input terminal and a second input terminal using an operating amplifier and a plurality of resistors, the amplification circuit comprising:
   an adjustment circuit configured to adjust a frequency property of the output signal for an in-phase alternating current signal input between the first input terminal and the second input terminal, wherein
   the adjustment circuit is connected to one input terminal of the first input terminal and the second input terminal through one or more resistors,
   the adjustment circuit includes a capacitor part whose capacitance is set to be variable, and
   the adjustment is realized through variable setting of the capacitance of the capacitor part.

2. The amplification circuit according to claim 1, wherein
   an inverting input terminal of the operating amplifier is connected to the one input terminal through a first resistor and is also connected to an output terminal of the operating amplifier through a series circuit of a second resistor and a third resistor,
   a non-inverting input terminal of the operating amplifier is input with a signal based on a signal at another input terminal of the first input terminal and the second input terminal, and
   the adjustment circuit is inserted between a connection node between the second resistor and the third resistor, and a predetermined potential point.

3. The amplification circuit according to claim 1, wherein
   a non-inverting input terminal of the operating amplifier is connected to the one input terminal through a first resistor and is also connected to a predetermined first potential point through a series circuit of a second resistor and a third resistor,
   an inverting input terminal of the operating amplifier is input with a signal based on a signal at another input terminal of the first input terminal and the second input terminal, and
   the adjustment circuit is inserted between a connection node between the second resistor and the third resistor, and a predetermined second potential point.

4. The amplification circuit according to claim 1, wherein
   a first adjustment circuit and a second adjustment circuit each including a capacitor part whose capacitance is set to be variable are disposed as the adjustment circuit,
   an inverting input terminal of the operating amplifier is connected to the first input terminal through a first resistor and is also connected to an output terminal of the operating amplifier through a series circuit of a second resistor and a third resistor,
   the first adjustment circuit is inserted between a connection node between the second resistor and the third resistor, and a predetermined first potential point,
   a non-inverting input terminal of the operating amplifier is connected to the second input terminal through a fourth resistor and is also connected to a predetermined second potential point through a series circuit of a fifth resistor and a sixth resistor, and
   the second adjustment circuit is inserted between a connection node between the fifth resistor and the sixth resistor, and a predetermined third potential point.

5. The amplification circuit according to claim 1, wherein
   an inverting input terminal of the operating amplifier is connected to the one input terminal through a first resistor and is also connected to an output terminal of the operating amplifier through a second resistor, a non-inverting input terminal of the operating amplifier is input with a signal based on a signal at another input terminal of the first input terminal and the second input terminal, and the adjustment circuit is inserted between the inverting input terminal of the operating amplifier and a predetermined potential point.

6. The amplification circuit according to claim 1, wherein a non-inverting input terminal of the operating amplifier is connected to the one input terminal through a first resistor and is also connected to a predetermined first potential point through a second resistor, an inverting input terminal of the operating amplifier is input with a signal based on a signal at another input terminal of the first input terminal and the second input terminal, and the adjustment circuit is inserted between the non-inverting input terminal of the operating amplifier and a predetermined second potential point.

7. The amplification circuit according to claim 1, wherein a first adjustment circuit and a second adjustment circuit each including a capacitor part whose capacitance is set to be variable are disposed as the adjustment circuit, an inverting input terminal of the operating amplifier is connected to the first input terminal through a first resistor and is also connected to an output terminal of the operating amplifier through a second resistor, the first adjustment circuit is inserted between the inverting input terminal of the operating amplifier and a predetermined first potential point, a non-inverting input terminal of the operating amplifier is connected to the second input terminal through a third resistor and is also connected to a predetermined second potential point through a fourth resistor, and the second adjustment circuit is inserted between the non-inverting input terminal of the operating amplifier and a predetermined third potential point.

8. The amplification circuit according to claim 1, wherein an inverting input terminal of the operating amplifier is connected to the one input terminal through a series circuit of a first resistor and a second resistor and is also connected to an output terminal of the operating amplifier through a third resistor, a non-inverting input terminal of the operating amplifier is input with a signal based on a signal at another input terminal of the first input terminal and the second input terminal, and the adjustment circuit is inserted between a connection node between the first resistor and the second resistor, and a predetermined potential point.

9. The amplification circuit according to claim 1, wherein a non-inverting input terminal of the operating amplifier is connected to the one input terminal through a series circuit of a first resistor and a second resistor and is also connected to a predetermined first potential point through a third resistor, an inverting input terminal of the operating amplifier is input with a signal based on a signal at another input terminal of the first input terminal and the second input terminal, and the adjustment circuit is inserted between a connection node between the first resistor and the second resistor, and a predetermined second potential point.

10. The amplification circuit according to claim 1, wherein a first adjustment circuit and a second adjustment circuit each including a capacitor part whose capacitance is set to be variable are disposed as the adjustment circuit, an inverting input terminal of the operating amplifier is connected to the first input terminal through a series circuit of a first resistor and a second resistor and is also connected to an output terminal of the operating amplifier through a third resistor, the first adjustment circuit is inserted between a connection node between the first resistor and the second resistor, and a predetermined first potential point, a non-inverting input terminal of the operating amplifier is connected to the second input terminal through a series circuit of a fourth resistor and a fifth resistor and is also connected to a predetermined second potential point through a sixth resistor, and the second adjustment circuit is inserted between a connection node between the fourth resistor and the fifth resistor, and a predetermined third potential point.

11. The amplification circuit according to claim 1, wherein the amplification circuit produces the output signal on a basis of a signal obtained by causing a signal at an output terminal of the operating amplifier to pass through a lowpass filter.

12. A semiconductor device that forms an amplification circuit configured to output an output signal formed by amplifying a differential signal between a first input terminal and a second input terminal using an operating amplifier and a plurality of resistors, the amplification circuit including an adjustment circuit configured to adjust a frequency property of the output signal for an in-phase alternating current signal input between the first input terminal and the second input terminal, the adjustment circuit being connected to one input terminal of the first input terminal and the second input terminal through one or more resistors, the adjustment circuit including a capacitor part whose capacitance is set to be variable, the adjustment being realized through variable setting of the capacitance of the capacitor part, wherein the amplification circuit is formed using an integrated circuit.

13. A motor driver device that drives a motor, the motor driver device comprising:

an amplification circuit that amplifies and outputs a signal corresponding to a current supplied to the motor; and an output-stage circuit that applies a voltage corresponding to an output signal of the amplification circuit, to the motor, wherein the motor driver device comprises, as the amplification circuit, an amplification circuit that outputs an output signal formed by amplifying a differential signal between a first input terminal and a second input terminal using an operating amplifier and a plurality of resistors, the amplification circuit including an adjustment circuit configured to adjust a frequency property of the output signal for an in-phase alternating current signal input between the first input terminal and the second input terminal, the adjustment circuit being connected to one input terminal of the first input terminal and the second input terminal through one or more resistors, the adjustment circuit including a capacitor part whose capacitance is set to be variable,
the adjustment being realized through variable setting of the capacitance of the capacitor part, and
a signal corresponding to the current supplied to the motor is applied to a point between the first input terminal and the second input terminal.

* * * * *